(12) United States Patent
Yamashita

(10) Patent No.: US 10,411,139 B2
(45) Date of Patent: Sep. 10, 2019

(54) SEMICONDUCTOR DEVICE AND METHOD OF MANUFACTURING THE SEMICONDUCTOR DEVICE

(71) Applicant: Renesas Electronics Corporation, Koutou-ku, Tokyo (JP)

(72) Inventor: Tomohiro Yamashita, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/657,136

(22) Filed: Jul. 22, 2017

(65) Prior Publication Data
US 2018/0090626 A1    Mar. 29, 2018

(30) Foreign Application Priority Data

Sep. 29, 2016  (JP) ................. 2016-191808

(51) Int. Cl.
| | | |
|---|---|---|
| *H01L 29/792* | (2006.01) | |
| *H01L 21/28* | (2006.01) | |
| *H01L 21/285* | (2006.01) | |
| *H01L 29/06* | (2006.01) | |
| *H01L 29/08* | (2006.01) | |
| *H01L 29/45* | (2006.01) | |
| *H01L 29/66* | (2006.01) | |
| *H01L 29/78* | (2006.01) | |

(Continued)

(52) U.S. Cl.
CPC ...... *H01L 29/792* (2013.01); *H01L 21/28282* (2013.01); *H01L 21/28518* (2013.01); *H01L 27/11568* (2013.01); *H01L 29/0653* (2013.01); *H01L 29/0847* (2013.01); *H01L 29/42344* (2013.01); *H01L 29/45* (2013.01); *H01L 29/665* (2013.01); *H01L 29/66795* (2013.01); *H01L 29/66833* (2013.01); *H01L 29/785* (2013.01); *H01L 29/7851* (2013.01)

(58) Field of Classification Search
CPC ............... H01L 29/792; H01L 29/7855; H01L 29/7851; H01L 27/11568; H01L 29/7856
See application file for complete search history.

(56) References Cited

U.S. PATENT DOCUMENTS

| | | |
|---|---|---|
| 8,461,640 B2 | 6/2013 | Hu et al. |
| 9,543,314 B2 | 1/2017 | Mihara |

(Continued)

FOREIGN PATENT DOCUMENTS

| | | |
|---|---|---|
| JP | 2013-504221 A | 2/2013 |
| JP | 2016-051735 A | 4/2016 |

OTHER PUBLICATIONS

Extended European Search Report dated Feb. 20, 2018, in European Patent Application No. EP17184895.5.

*Primary Examiner* — Wael M Fahmy
*Assistant Examiner* — Sarah K Salerno
(74) *Attorney, Agent, or Firm* — Shapiro, Gabor and Rosenberger, PLLC

(57) ABSTRACT

Resistance of a gate electrode is reduced in a split gate MONOS memory configured by a fin FET. A memory gate electrode of a split gate MONOS memory is formed of a first polysilicon film, a metal film, and a second polysilicon film formed in order on a fin. A trench between fins adjacent to each other in a lateral direction of the fins is filled with a stacked film including the first polysilicon film, the metal film, and the second polysilicon instead of the first polysilicon film only.

12 Claims, 20 Drawing Sheets

(51) Int. Cl.
*H01L 29/423* (2006.01)
*H01L 27/11568* (2017.01)

(56) References Cited

U.S. PATENT DOCUMENTS

| | | | |
|---|---|---|---|
| 2005/0260814 A1* | 11/2005 | Cho | H01L 21/28273 438/257 |
| 2008/0254585 A1 | 10/2008 | Takaya | |
| 2015/0206891 A1 | 7/2015 | Chuang et al. | |
| 2016/0064389 A1 | 3/2016 | Mihara | |
| 2017/0062440 A1* | 3/2017 | Arigane | H01L 21/28282 |
| 2017/0352675 A1* | 12/2017 | Mihara | H01L 21/28282 |

* cited by examiner

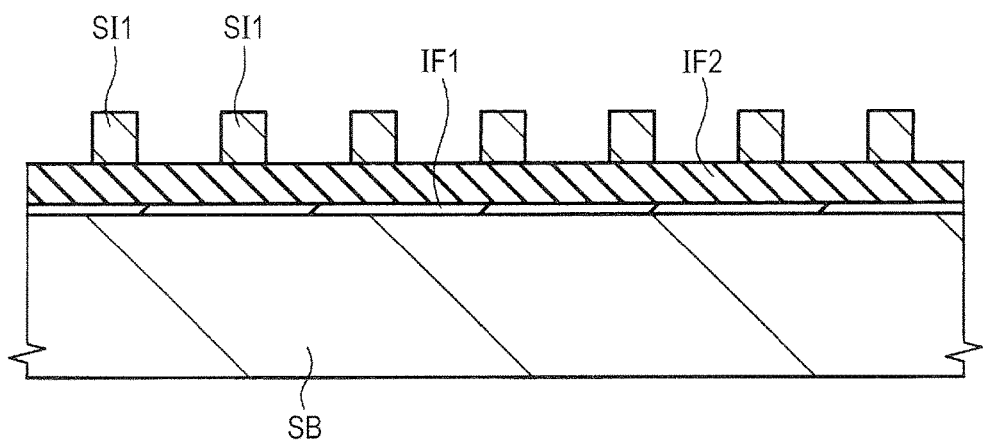
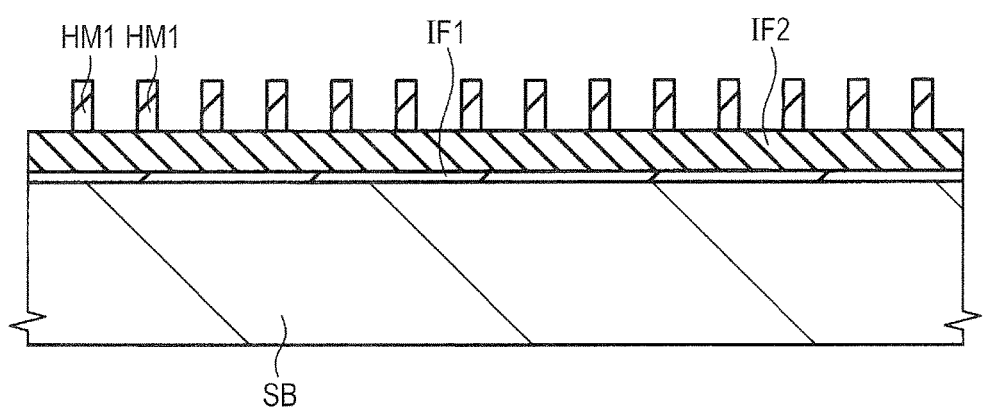

| OPERATION / APPLIED VOLTAGE | Vd | Vcg | Vmg | Vs | Vb |
|---|---|---|---|---|---|
| WRITE | Vdd | 1 V | 12 V | 6 V | 0 |
| ERASE | 0 | 0 | -6 V | 6 V | 0 |
| READ | Vdd | Vdd | 0 | 0 | 0 |

Vdd = 1.5 V

SEMICONDUCTOR DEVICE AND METHOD OF MANUFACTURING THE SEMICONDUCTOR DEVICE

CROSS-REFERENCE TO RELATED APPLICATIONS

The disclosure of Japanese Patent Application No. 2016-191808 filed on Sep. 29, 2016 including the specification, drawings and abstract is incorporated herein by reference in its entirety.

BACKGROUND

The present invention relates to a semiconductor device and a method of manufacturing the semiconductor device, and more particularly relates to a technique effectively applied to a semiconductor device including a fin transistor.

A fin field effect transistor is known as a field effect transistor that operates at high speed, and allows a reduction in leakage current, power consumption, and size. The fin field effect transistor (FINFET) is, for example, a semiconductor element that has a channel layer including a pattern of a plate-like (wall-like) semiconductor layer protruding above a substrate, and has a gate electrode formed so as to straddle the pattern.

The electrically erasable and programmable read only memory (EEPROM) is widely used as an electrically writable and erasable, nonvolatile semiconductor memory device. Such memory devices typified by a currently widely used flash memory each have a conductive floating gate electrode surrounded by an oxide film or a trapping insulating film below a gate electrode of a MISFET, and a charge storage state in the floating gate or the trapping insulating film is used as memory information, and is read as a threshold of the transistor. The trapping insulating film refers to a charge-storable insulating film, and includes, for example, a silicon nitride film. Electron charges are injected or emitted into/from such a charge storage region to shift the threshold of the MISFET so that the MISFET operates as a memory element. Such a flash memory includes a split gate cell using a metal-oxide-nitride-oxide-semiconductor (MONOS) film.

Japanese Unexamined Patent Application Publication (Translation of PCT Application) No. 2013-504221 describes a split gate flash memory having a FINFET.

Japanese Unexamined Patent Application Publication No. 2016-51735 describes a split gate MONOS memory, in which a memory gate electrode is formed of a polysilicon film and a metal film on the polysilicon film.

SUMMARY

A reduction in resistance of a gate electrode is a typical issue of FETs. The same point is valid with regard to a split gate MONOS memory. In an existing method for reducing resistance of a control gate electrode or a memory gate electrode, such a gate electrode is formed of a metal film or a stacked film including a silicon film and a metal film on the silicon film. However, when the entire memory gate electrode is formed of a metal film, an insulating film between a trapping insulating film (charge storage film) and the memory gate electrode react with the metal film, which deteriorates a charge retention characteristic of the trapping insulating film.

Other objects and novel features will be clarified from the description of this specification and the accompanying drawings.

A typical one of embodiments disclosed in this application is briefly summarized as follows.

In a semiconductor device of one embodiment, a memory gate electrode of a memory cell provided over each of a plurality of fins is formed of a semiconductor film and a metal film formed in order on the fin, and a space between the fins is filled with the semiconductor film and the metal film.

In a method of manufacturing a semiconductor device according to one embodiment, a memory gate electrode of a memory cell provided on each of a plurality of fins is formed of a semiconductor film and a metal film formed in order on the fin, and a space between the fins is filled with the semiconductor film and the metal film.

According to one embodiment disclosed in the present application, performance of a semiconductor device can be improved.

BRIEF DESCRIPTION OF THE DRAWINGS

FIG. 7 is a sectional view of the semiconductor device of the first embodiment of the invention during a manufacturing process of the semiconductor device.

FIG. 8 is a sectional view of the semiconductor device during the manufacturing process following FIG. 7.

DETAILED DESCRIPTION

Although each of the following embodiments may be dividedly described in a plurality of sections or embodiments for convenience as necessary, they are not unrelated to one another except for the particularly defined case, and are in a relationship where one is a modification, details, supplementary explanation, or the like of part or all of another one. In each of the following embodiments, when the number of elements and the like (including the number, a numerical value, amount, and a range) is mentioned, the number is not limited to a specified number except for the particularly defined case and for the case where the number is principally clearly limited to the mentioned number. In other words, the number may be not less than or not more than the mentioned number. Furthermore, it will be appreciated that in each of the following embodiments, a constitutional element (including an element step etc.) of the embodiment is not necessarily indispensable except for the particularly defined case and for the case where the constitutional element is considered to be indispensable in principle. Similarly, in each of the following embodiments, when a shape of a constitutional element, a positional relationship, and the like are described, any configuration substantially closely related to or similar to such a shape or the like should be included except for the particularly defined case and for the case where such a configuration is considered to be not included in principle. The same point is valid with regard to each of the numerical value and the range.

Hereinafter, some embodiments will be described in detail with reference to the accompanying drawings. In all drawings for explaining the embodiments, components having the same function are designated by the same numeral, and duplicated description is omitted. In the following embodiments, the same or similar portion is not repeatedly described in principle except for a particularly required case.

First Embodiment

Exemplary Layout Configuration of Semiconductor Chip

Figure 1:
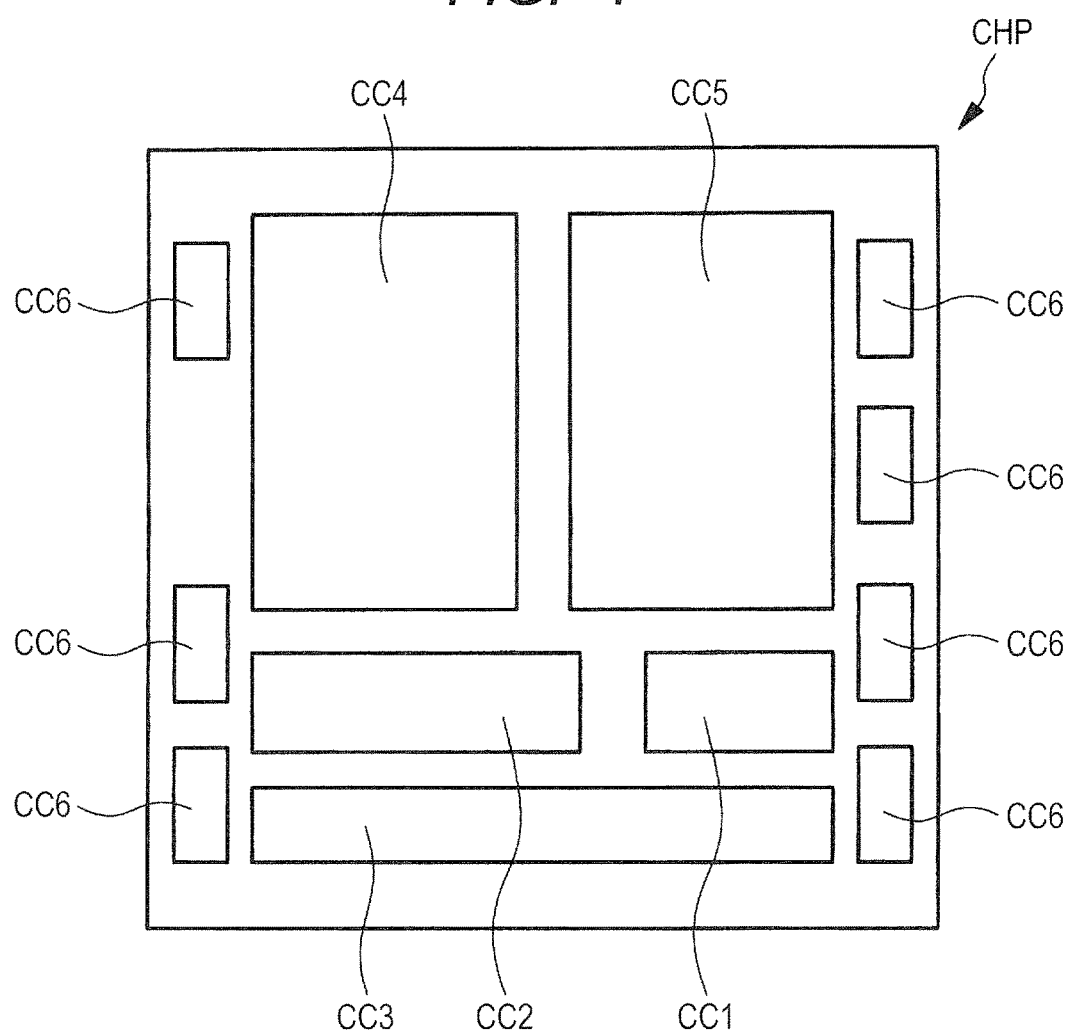
FIG. 1 is a schematic diagram illustrating a layout configuration of a semiconductor chip of a first embodiment of the invention.

A semiconductor device having a nonvolatile memory of a first embodiment is now described with reference to some drawings. First, a layout configuration of a semiconductor device (semiconductor chip) having a system including a nonvolatile memory is described. FIG. 1 is a schematic diagram illustrating an exemplary layout configuration of a semiconductor chip CHP of the first embodiment. In FIG. 1, the semiconductor chip CHP includes a central processing unit (CPU) CC1, a random access memory (RAM) CC2, and an analog circuit CC3. The semiconductor chip CHP further includes an electrically erasable programmable read only memory (EEPROM) CC4, a flash memory CC5, and an input/output (I/O) circuit CC6, and thus configures a semiconductor device.

The CPU (circuit) CC1, which may be called a central processing unit, reads and decodes instructions from a memory device, and performs various types of arithmetic operation and control based on the instructions.

The RAM (circuit) CC2 is a memory, from which memory information can be randomly read, i.e., randomly stored memory information can be read, and into which memory information can be newly written, and is also called random-access memory. A static RAM (SRAM) including a static circuit is used as the RAM.

The analog circuit CC3 is a circuit that processes a voltage signal and a current signal, which each vary continuously over time, i.e., processes analog signals, and includes, for example, an amplifier circuit, a conversion circuit, a modulation circuit, an oscillation circuit, and a power supply circuit.

The EEPROM CC4 and the flash memory CC5 are each one of nonvolatile memories, which allows memory information to be electrically rewritten in write operation and erase operation, and are each also called electrically erasable programmable read only memory. A memory cell of the EEPROM CC4 or the flash memory CC5 is comprised of, for example, a metal oxide nitride oxide semiconductor (MONOS) transistor or a metal nitride oxide semiconductor (MNOS) transistor for memory. For example, the EEPROM CC4 and the flash memory CC5 are different from each other in that the EEPROM CC4 is a nonvolatile memory that can be erased in bytes while the flash memory CC5 is a nonvolatile memory that can be erased in word lines. In general, the flash memory CC5 stores programs for various types of processing to be executed by the CPU CC1. On the other hand, the EEPROM CC4 stores various data to be rewritten at a high frequency. The EEPROM CC4 or the flash memory CC5 includes a memory cell array including a plurality of nonvolatile memory cells arranged in a matrix, and further includes an address buffer, a row decoder, a column decoder, a verify sense amplifier circuit, a sense amplifier circuit, a write circuit, and the like.

The I/O circuit CC6, which is an input/output circuit, outputs data from within the semiconductor chip CHP to an external device coupled to the semiconductor chip CHP, or receives data from the external device coupled to the semiconductor chip CHP and sends the data into the semiconductor chip, for example.

The semiconductor device of the first embodiment has a memory cell region and a logic circuit region. The memory cell region has a memory cell array including a plurality of nonvolatile memory cells arranged in a matrix. The logic circuit region has the CPU CC1, a RAM CC2, the analog circuit CC3, the I/O circuit CC6, an address buffer for the EEPROM CC4 or the flash memory CC5, a row decoder, a column decoder, the verify sense amplifier circuit, and the sense amplifier circuit or the write circuit.

Structure of Semiconductor Device

Figure 2:
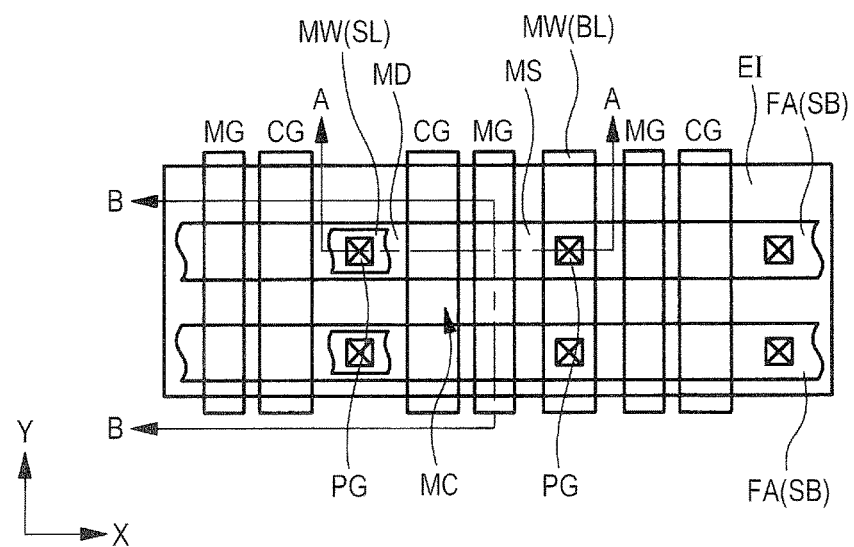
FIG. 2 is a plan view illustrating a semiconductor device of the first embodiment of the invention.
Figure 3:
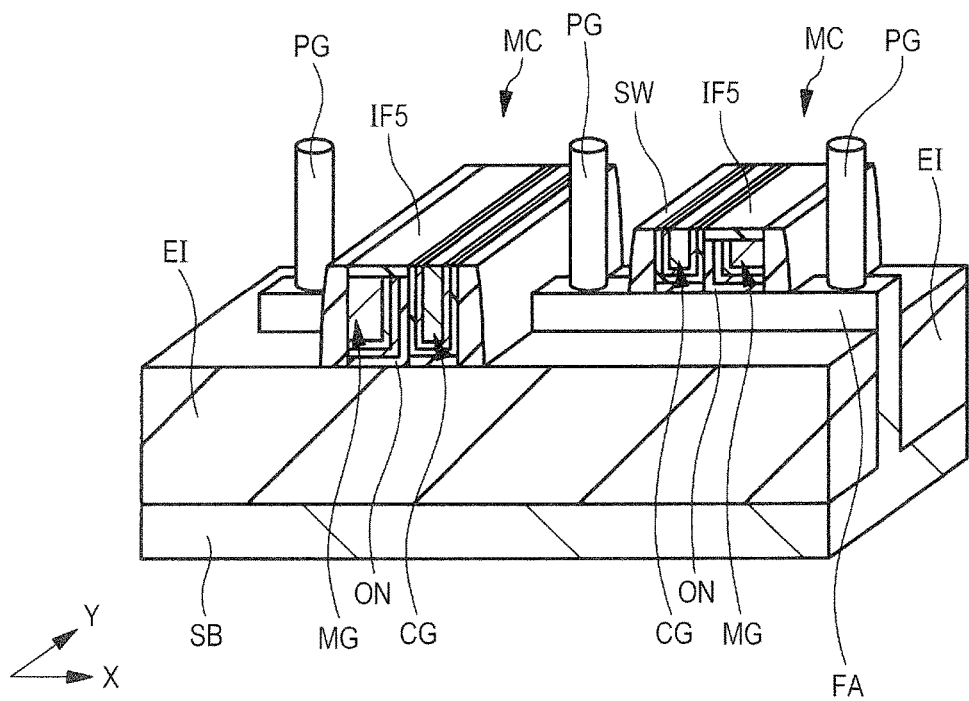
FIG. 3 is a perspective view illustrating the semiconductor device of the first embodiment of the invention.
Figure 4:
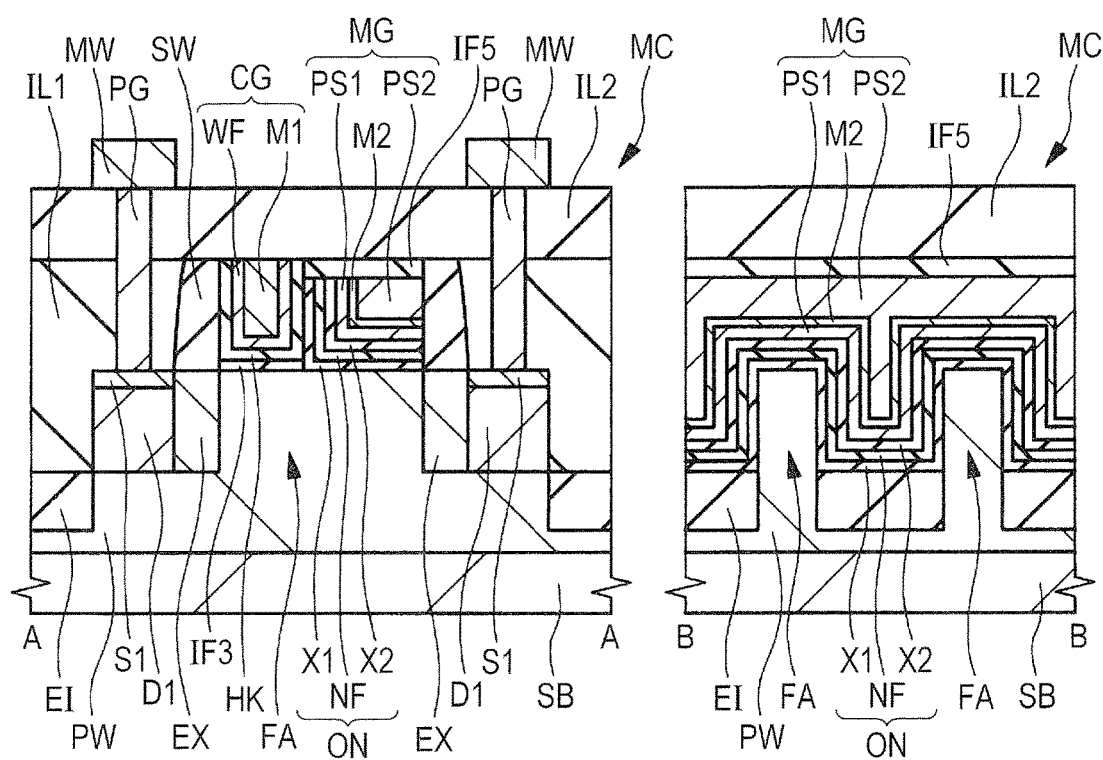
FIG. 4 is a sectional view illustrating the semiconductor device of the first embodiment of the invention.
Figure 5:
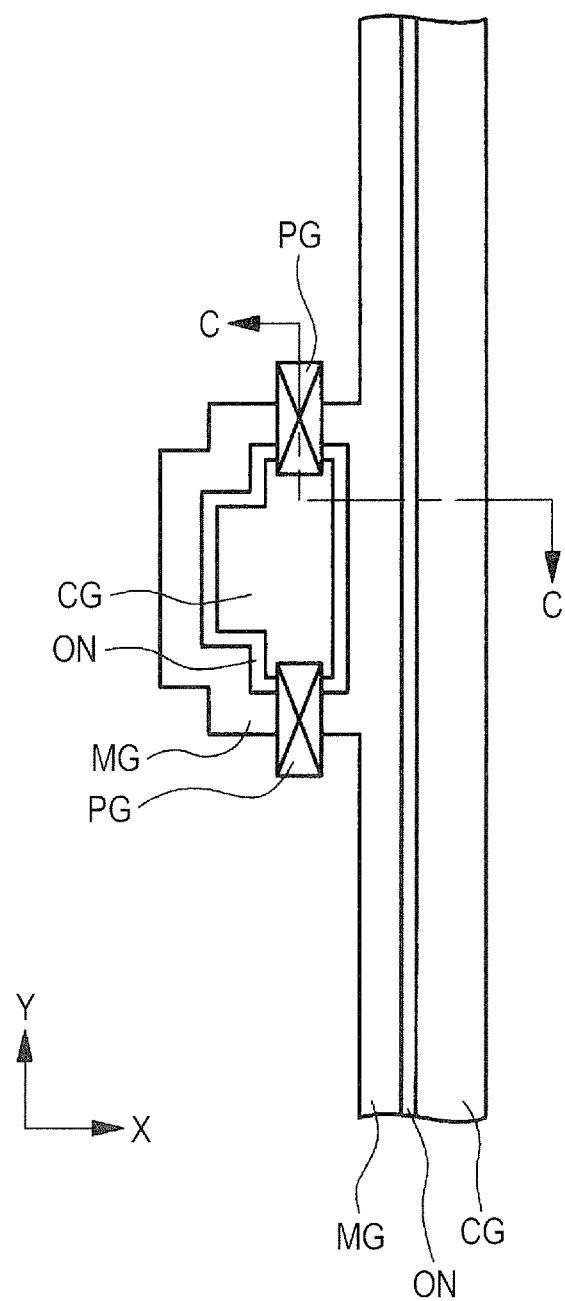
FIG. 5 is a plan view illustrating the semiconductor device of the first embodiment of the invention.
Figure 6:
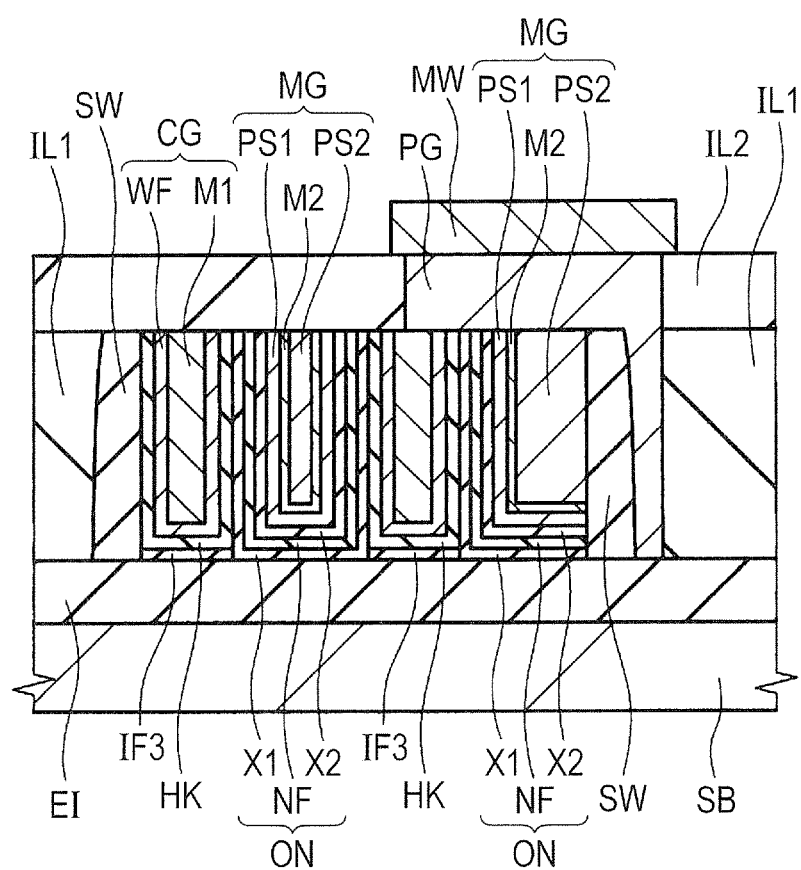
FIG. 6 is a sectional view along a line C-C in FIG. 5.

A structure of the semiconductor device of the first embodiment is now described with reference to FIGS. 2 to 6. FIG. 2 is a plan view of the semiconductor device of the first embodiment. FIG. 3 is a perspective view of the semiconductor device of the first embodiment. FIGS. 4 and 6 are each a sectional view of the semiconductor device of the first embodiment. FIG. 5 is a plan view of the semiconductor device of the first embodiment. FIG. 4 shows respective sections along a line A-A and a line B-B in FIG. 2. FIG. 6 shows a section along a line C-C in FIG. 5. FIG. 3 omits an interlayer insulating film, a silicide layer, and an interconnection on a semiconductor substrate, and further omits source and drain regions and a well in the semiconductor substrate.

FIG. 2 shows a plan view of the memory cell array. A plurality of memory cells MC formed in the memory cell array are provided, for example, in the flash memory CC5 in FIG. 1. Hereinafter, the region having the memory cells is called memory cell region.

A plurality of fins FA extending in an X direction are disposed at equal intervals in a Y direction in the memory cell region 1A. The X direction and the Y direction are each a direction along the main surface of a semiconductor substrate SB, and the X direction is orthogonal to the Y direction. Each fin FA is, for example, a rectangular parallelepiped protrusion (convex portion) selectively protruding from the main surface of the semiconductor substrate SB, and has a wall-like (plate-like) shape. The fin FA is a part of the semiconductor substrate SB, and acts as an active region of the semiconductor substrate SB. A space between the adjacent fins FA is filled with an element isolation film EI, and each fin FA is surrounded by the element isolation film EI in planar view. The fin FA acts as an active region for forming the memory cell MC. The semiconductor substrate SB is made of, for example, p-type single crystal silicon having a specific resistance of about 1 to 10 Ωcm.

The lower end portion of the fin FA is surrounded by the element isolation film EI covering the main surface of the semiconductor substrate SB. However, a part of the fin FA protrudes above the element isolation film EI. In other words, a region between the adjacent fins is not entirely filled with the element isolation film EI.

A plurality of control gate electrodes CG and a plurality of memory gate electrodes MG extending in the Y direction are disposed on the fins FA. A drain region MD on a side close to the control gate electrode CG and a source region MS on a side close to the memory gate electrode are provided on the top of the fin FA so as to sandwich the control gate electrode CG and the memory gate electrode MG. Specifically, one control gate electrode CG and one memory gate electrode MG adjacent to each other in the X direction are located between the source region MS and the drain region MD.

The drain region MD and the source region MS are each an n-type semiconductor region. The drain region MD is provided between two control gate electrodes CG adjacent to each other in the X direction, and the source region MS is provided between two memory gate electrodes MG adjacent to each other in the X direction. The memory cell MC is a nonvolatile memory element having the control gate electrode CG, the memory gate electrode MG, the drain region MD, and the source region MS. Hereinafter, the source region MS and the drain region MD configuring one memory cell MC may be referred to as source/drain region.

Two memory cells MC adjacent to each other in the X direction share the drain region MD or the source region MS. The two memory cells MC sharing the drain region MD are axisymmetric in the X direction with the drain region MD extending in the Y direction as an axis. The two memory cells MC sharing the source region MS are axisymmetric in the X direction with the source region MS extending in the Y direction as an axis.

Each fin FA has a plurality of memory cells MC arranged in the X direction. The drain region MD of each memory cell MC is electrically coupled to a source line SL including an interconnection MW extending in the X direction via a plug (contact plug) PG formed in a contact hole penetrating through an undepicted interlayer insulating film formed on the memory cell MC. The source regions MS of the memory cells MC arranged in the Y direction are electrically coupled to a bit line BL including an interconnection MW extending in the Y direction.

The fin FA is, for example, a rectangular parallelepiped protrusion protruding from the main surface of the semiconductor substrate SB in a direction perpendicular to the main surface. The fin FA may not necessarily have a rectangular parallelepiped shape, but may have a rectangular shape having rounded corners in sectional view in a short side direction. Although each side face of the fin FA may be perpendicular to the main surface of the semiconductor substrate SB, the side face may have an inclination angle close to the vertical. That is, the sectional shape of the fin FA is a rectangular parallelepiped or a trapezoid. In this exemplary case, the side faces of the fin FA are each obliquely inclined with respect to the main surface of the semiconductor substrate SB.

As illustrated in FIG. 2, a direction, in which the fins FA extend in planar view, is the long side direction of each fin, and the direction orthogonal to the long side direction is the short side direction of the fin. That is, length of the fin is larger than width thereof. The fin FA may have any shape as long as the fin includes a protrusion having a length, a width, and a height. For example, the fin may have a meandering layout in planar view.

FIG. 3 shows two memory cells MC formed side by side on one fin FA, in which the control gate electrode CG, the memory gate electrode MG, and the ONO film ON of the memory cell MC on the left side of the drawing are shown with their cross sections directly over the element isolation film EI, and the control gate electrode CG, the memory gate electrode MG, and the ONO film ON of the memory cell MC on the right side of the drawing are shown with their cross sections directly over the fin FA. A memory cell MC is provided above the fin FA configuring the semiconductor substrate SB in the memory cell region. As illustrated in FIG. 3, the control gate electrode CG and the memory gate electrode MG extend in the Y direction so as to stride over the fin FA.

FIG. 4 shows, side by side, across section of a semiconductor element along a line A-A in FIG. 2 and a cross section of the semiconductor element along a line B-B in FIG. 2. Specifically, a cross section along a gate length direction (X direction) of a FINFET configuring the memory cell MC is shown on the left side of FIG. 4, and a cross section, which includes two fins FA, along a gate width direction (Y direction) of the FINFET configuring the memory cell MC is shown on the right side of FIG. 4. The cross section shown on the right side of FIG. 4 includes the memory gate electrode MG configuring the memory cell MC. Although a plurality of elements are arranged on one fin FA, only one memory cell MC is shown on the fin FA in FIG. 4. Furthermore, FIG. 4 shows the oxide nitride oxide (ONO) film ON having a stacked structure as one insulating film without separately showing the insulating films forming the ONO film ON.

As illustrated in FIGS. 3 and 4, a plurality of protrusions as part of the semiconductor substrate SB are arranged in the Y direction over the semiconductor substrate SB. The side faces of each fin FA are partially surrounded by the element isolation film EI formed on the main surface of the semiconductor substrate SB. The element isolation film EI is embedded in a region between the adjacent fins FA. However, the element isolation film EI fills only part of the region between the adjacent fins FA, and upper ends of the fins FA protrude above the element isolation film EI. That is, the fins are isolated from one another by the element isolation film EI. As illustrated in FIG. 4, a p-type well PW being a p-type semiconductor region is provided in the fin FA from the top to the lower part of the fin FA.

The control gate electrode CG is provided on the top and the side faces of the fin FA and on the element isolation film EI with a gate insulating film in between, and the memory gate electrode MG is provided in a region adjacent to the control gate electrode CG with an ONO film ON in between in the long side direction (X direction) of the fin FA. The ONO film ON is interposed between the control gate electrode CG and the memory gate electrode MG, and the control gate electrode CG is electrically isolated from the memory gate electrode MG by the ONO film ON. The ONO film ON is interposed between the memory gate electrode MG and the top of the fin FA. The insulating film ON is continuously provided so as to cover the side faces and the bottom of the memory gate electrode MG. Hence, the ONO film ON has an L-shaped section along the gate length direction as illustrated in FIG. 4.

The gate insulating film includes a stacked film of a thermal oxide film (silicon oxide film, insulating film IF3) formed by thermally oxidizing the main surface and the side faces of the fin FA that is a protrusion of the semiconductor substrate SB made of silicon and a high dielectric constant film (high dielectric film) HK, and has a thickness of 2.5 nm, for example. The insulating film IF3 forming the gate insulating film has a thickness of, for example, 1 nm, and the high dielectric constant film HK, which is provided on the insulating film IF3 and also configures the gate insulating film, has a thickness of 1.5 nm, for example. The high dielectric constant film HK is an insulating film including a HfO film, a HfON film, or a HfSiON film, and has a dielectric constant higher than each of silicon oxide and silicon nitride.

The entire insulating film IF3 is provided along the surface of the fin FA. That is, the insulating film IF3 is formed so as to cover the bottom of the control gate electrode CG. On the other hand, the high dielectric constant film HK is provided so as to cover the bottom and the side faces of the control gate electrode CG.

The ONO film ON includes a silicon oxide film X1 including a thermal oxide film (silicon oxide film) 4 nm in thickness formed by thermally oxidizing the main surface and the side faces of the fin FA that is the protrusion of the semiconductor substrate SB made of silicon, a silicon nitride film NF formed on the silicon oxide film X1, and a silicon oxide film X2 formed on the silicon nitride film NF. The silicon nitride film NF acts as a charge storage part (charge storage film, charge storage layer) of the memory cell MC. The silicon nitride film has a thickness of, for example, 7 nm, and the silicon oxide film X2 has a thickness of, for example, 9 nm.

That is, the ONO film ON has a stacked structure including the silicon oxide film X1, the silicon nitride film NF, and the silicon oxide film X2, which are stacked in order from two sides, i.e., a side close to the top of the fin FA and a side close to the side face of the control gate electrode CG. The thickness of the ONO film ON is larger than the thickness of the gate insulating film under the control gate electrode CG, and is 20 nm, for example. A silicon oxynitride film may be formed as the film X2 in place of the silicon oxide film X2.

The control gate electrode CG extends in the short side direction (Y direction) of the fin FA, and is provided adjacent to the top and the side faces of the fin FA and the top of the element isolation film EI with the gate insulating film in between. Similarly, the memory gate electrode MG extends in the short side direction of the fin FA, and is provided adjacent to the top and the side face of the fin FA and the top of the element isolation film EI with the ONO film ON in between. That is, the gate insulating film and the control gate electrode CG completely fill a trench between the fins FA adjacent to each other in the short side direction of the fin FA. In addition, the ONO film ON and the memory gate electrode MG completely fill a trench between the fins FA adjacent to each other in the short side direction of the fin FA. The tops of the memory gate electrode MG and the ONO film ON are each covered with an insulating film IF5 that extends in the Y direction as with the memory gate electrode MG. The insulating film IF5 includes, for example, a silicon nitride film.

Each side face of a pattern including the control gate electrode CG, the memory gate electrode MG, the ONO film ON, and the insulating film IF5 is covered with a sidewall (sidewall spacer) SW. The sidewall SW has a stacked structure of a silicon nitride film and a silicon oxide film, for example. In the drawing, however, the sidewall SW is shown as one film, i.e., the silicon nitride film and the silicon oxide film are not separately shown.

As illustrated in FIG. 4, a pair of a source region and a drain region are provided on the top of the fin FA so as to sandwich the top of the fin FA directly below the pattern including the control gate electrode CG and the memory gate electrode MG. Each of the source and drain regions has an extension region EX as an n$^-$-type semiconductor region and a diffusion region D1 as an n$^+$-type semiconductor region. The extension region EX and the diffusion region D1 are each a semiconductor region formed by introducing an n-type impurity (for example, phosphorus (P) or arsenic (As)) into the fin FA.

The diffusion region D1 has a high impurity concentration compared with the extension region EX. The extension region EX may have a depth deeper or shallower than the diffusion region D1. The extension region EX is in contact with the diffusion region D1 in each of the source and drain regions, and the extension region EX is located in the top of the fin FA directly below the pattern, i.e., located on a side close to a channel region compared with the diffusion region D1.

The drain region is adjacent to the fin FA directly below the control gate electrode CG, and the source region is adjacent to the fin FA directly below the memory gate electrode MG. That is, the source/drain region sandwiches the pattern including the control gate electrode CG and the memory gate electrode MG in planar view, and the drain region is located on a side close to the control gate electrode CG, and the source region is located on a side close to the memory gate electrode MG. In other words, the drain region is adjacent to the control gate electrode CG while the source region is adjacent to the memory gate electrode MG in planar view.

In this way, the source/drain region, which has a structure including the extension region EX having a low impurity concentration and the diffusion region D1 having a high impurity concentration, i.e., a lightly doped drain (LDD) structure, is formed, thereby it is possible to improve short channel characteristics of the transistor having such a source/drain region. The source region of that source/drain region corresponds to the source region MS shown in FIG. 2, and the drain region thereof corresponds to the drain region MD shown in FIG. 2.

A silicide layer S1 is provided on a surface of each of the source region and the drain region exposed from the pattern including the control gate electrode CG, the memory gate electrode MG, and the sidewall SW, i.e., on the surface of the diffusion region D1. The silicide layer S1 is made of, for example, nickel silicide (NiSi).

An interlayer insulating film IL1 including, for example, a silicon oxide film is provided on the fin FA and the element isolation film EI. The interlayer insulating film IL1 covers the fin FA, the element isolation film EI, and the silicide layer S1, and the top of the interlayer insulating film IL1 is planarized at a height substantially equal to the height of the top of each of the control gate electrode CG, the memory gate electrode MG, and the sidewall SW. An interlayer insulating film IL2 covering the tops of the control gate electrode CG, the memory gate electrode MG, and the sidewall SW is formed on the interlayer insulating film IL1. The top of the interlayer insulating film IL2 is planarized. The interlayer insulating film IL2 includes, for example, a silicon oxide film.

A plurality of interconnections MW are provided on the interlayer insulating film IL2, and each interconnection MW is electrically coupled to the source region or the drain region of the memory cell MC via a plug PG provided in a contact hole penetrating through the interlayer insulating films IL1 and IL2. Specifically, the bottom of the plug PG is directly in contact with the top of the silicide layer S1, and the plug PG is electrically coupled to the source region or the drain region via the silicide layer S1. The silicide layer S1 reduces a coupling resistance between the plug PG as a coupling part including a metal film mainly containing, for example, tungsten (W) and the source/drain region in the fin FA made of semiconductor.

In an undepicted power feeding region for the control gate electrode CG, a plug is coupled to the top of the control gate electrode CG. In a power feeding region (see FIGS. 5 and 6) for the memory gate electrode MG, the plug PG is coupled to the top of the memory gate electrode MG.

The memory cell MC is a nonvolatile memory element including the control gate electrode CG, the memory gate electrode MG, the drain region, and the source region. The control gate electrode CG and the source/drain region configure a control transistor, and the memory gate electrode MG and the source/drain region configure a memory transistor. The memory cell MC is comprised of the control transistor and the memory transistor. That is, the control transistor and the memory transistor share the source/drain region. A distance between the drain region and the source region in the gate length direction (X direction) of the control gate electrode CG or the memory gate electrode MG corresponds to the channel length of the memory cell MC. The control transistor and the memory transistor are each a FINFET having a channel including the surface of the fin FA.

The control gate electrode CG includes a metal film WF for adjustment of the threshold voltage of the control transistor and a metal film M1 on the metal film WF. The metal film WF covers the bottom and the side faces of the metal film M1. The metal film WF includes, for example, a TiAlN film. The metal film M1 is a main conductor film of the control gate electrode CG, and includes, for example, an aluminum (Al) film or a tungsten (W) film. Thus, the control gate electrode CG is formed of the metal films WF and M1 rather than a polysilicon film, and is thus reduced in resistance. When the control gate electrode CG is reduced in resistance in this way, the gate electrode of the memory transistor, which shares a channel with the control transistor, i.e., the memory gate electrode MG must also be reduced in resistance. In the first embodiment, therefore, part of the memory gate electrode MG is formed of a metal film M2 as described below.

The memory gate electrode MG includes a polysilicon film PS1, a metal film M2, and a polysilicon film PS2 formed in order on the ONO film ON. A material having heat resistance and a relatively low reactivity with silicon is used as a material of the metal film M2 formed on the polysilicon film PS1. Specifically, for example, a titanium nitride (TiN) film, a tantalum nitride (TaN) film, or a tungsten nitride (WN) film, which has a lower reactivity with silicon than the aluminum (Al) film or the tungsten (W) film, is used as the metal film M2.

As shown in the right diagram of FIG. 4, the polysilicon film PS1, the metal film M2, and the polysilicon film PS2, which collectively form the memory gate electrode MG, are partially provided below the top of the fin FA. In other words, a trench, which is located on the element isolation film EI between the two adjacent fins FA, is not completely filled only with the ONO film ON and the polysilicon film PS1. Furthermore, the trench is not completely filled only with the ONO film ON, the polysilicon film PS1, and the metal film M2.

Specifically, the trench between the two fins FA is completely filled with the ONO film ON, the polysilicon film PS1, the metal film M2, and the polysilicon film PS2. The completely filled state as referred to herein means a state in which the entire region between the adjacent fins FA is filled with a predetermined film. Hence, part of the top of each of the ONO film ON, the polysilicon film PS1, and the metal film M2 is located below the top of the fin FA. The polysilicon film PS1 has a thickness of, for example, 10 nm, and the metal film M2 has a thickness of, for example, 5 nm.

A height of the fin FA protruding above the element isolation film EI, i.e., a distance from the top of the fin FA to the top of the element isolation film EI in a direction perpendicular to the main surface of the semiconductor substrate SB is, for example, 40 to 60 nm. The total height of the fin FA, i.e., the distance from the top of the fin FA to the bottom of the element isolation film EI in the direction perpendicular to the main surface of the semiconductor substrate SB is, for example, 100 nm or more. A distance between the adjacent fins FA in the Y direction is, for example, 120 nm. The space between the adjacent fins FA is not completely filled with the ONO film ON, the polysilicon film PS1, and the metal film M2. This means that the total thickness of the ONO film ON, the polysilicon film PS1, and the metal film M2 is less than ½ of the distance between the adjacent fins FA.

The metal film M2 continuously covers the bottom of the polysilicon film PS2 and the side face of the polysilicon film PS2 on a side close to the control gate electrode CG. In other words, the metal film M2 has an L-shaped section. The polysilicon film PS1 continuously covers the bottoms of the metal film M2 and the polysilicon film PS2 and the side face of each of the metal film M2 and the polysilicon film PS2 on a side close to the control gate electrode CG. In other words, the polysilicon film PS1 has an L-shaped section. Hence, the silicon oxide film X1, the silicon nitride film NF, the silicon oxide film X2, the polysilicon film PS1, and the metal film M2 are sequentially formed from the side close to the control gate electrode CG to the side close to the polysilicon film PS1.

The tops of the polysilicon film PS1, the metal film M2, and the polysilicon film PS2 exist at the top of the memory gate electrode MG. In other words, the tops of the polysilicon film PS1, the metal film M2, and the polysilicon film PS2 are in contact with the bottom of the insulating film IF5.

Subsequently, a structure of a region for power feeding to the memory gate electrode is described with reference to FIGS. 5 and 6. No fin is provided in the power feeding region shown in FIGS. 5 and 6, and both the control gate electrode and the memory gate electrode are provided on the element isolation film in the power feeding region. In the power feeding region, the insulating film IF5 (see FIG. 4) on the memory gate electrode is removed in order to couple the plug to the memory gate electrode MG. In FIG. 5, each of the control gate electrode CG, the memory gate electrode MG, and the ONO film ON is shown as one film, and the stacked structure configuring each of the control gate electrode CG, the memory gate electrode MG, and the ONO film ON is not specifically shown.

As illustrated in FIGS. 5 and 6, in the power feeding region for the memory gate electrode MG, the plug PG is not coupled to the top of the memory gate electrode MG extending in parallel with the control gate electrode CG, but is coupled to a portion of the memory gate electrode MG protruding in the X direction from the memory gate electrode MG extending in the Y direction. Since the memory gate electrode MG is formed in a sidewall shape adjacent to the control gate electrode CG, a dummy pattern of the control gate electrode CG is provided so as to be adjacent to the memory gate electrode MG extending in the Y direction in order to allow the memory gate electrode MG to protrude in the X direction. Specifically, the control gate electrode CG extending in the Y direction and the control gate electrode CG as a dummy pattern are provided so as to sandwich, in the X direction, the memory gate electrode MG extending in the Y direction.

The control gate electrode CG as the dummy pattern has an island pattern surrounded by the memory gate electrode MG extending in the Y direction and the memory gate electrode MG as a protrusion, and is a pseudo gate electrode that does not contribute to formation of a memory cell and a circuit. In this structure, two plugs PG are coupled to the protruding memory gate electrode MG. Even if part of the plug is coupled to the control gate electrode CG as the dummy pattern, a problem such as short circuit does not occur because the control gate electrode CG does not contribute to formation of a memory and a circuit.

As illustrated in FIG. 6, the plug PG used for applying a memory gate voltage to the memory gate electrode MG is directly coupled to the metal film M2 forming the memory gate electrode MG. In detail, the top of the memory gate electrode MG includes the tops of the polysilicon film PS1, the metal film M2, and the polysilicon film PS2, and such tops are in contact with the bottom of the plug PG.

Although no silicide layer is provided on the tops of the polysilicon films PS1 and PS2, since the plug PG is coupled to the metal film M2, contact resistance between the plug PG and the memory gate electrode MG including the metal film M2 can be reduced. Since width of the memory gate electrode in the gate length direction (X direction) is extremely small, it may be difficult to form a silicide layer covering a top of a memory gate electrode made of polysilicon only, for example. In the first embodiment, however, it is possible to reduce the coupling resistance between the memory gate electrode MG and the plug PG without forming the silicide layer.

Operation of Nonvolatile Memory

Exemplary operation of the nonvolatile memory is now described with reference to FIGS. 25 and 26.

Figures 25, 26:
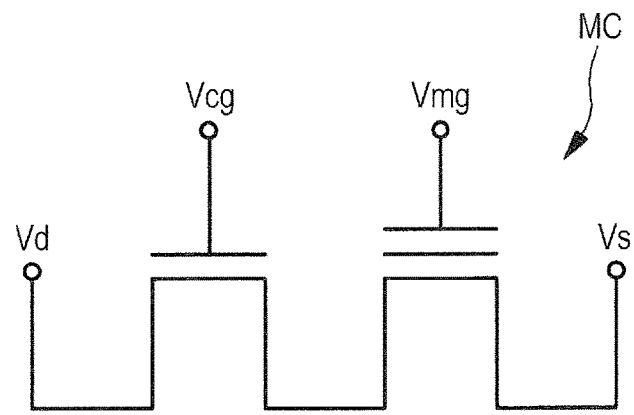
FIG. 25 is an equivalent circuit diagram of a memory cell of a nonvolatile memory.
FIG. 26 is a table showing an exemplary voltage application condition to each part of a selected memory cell in "write", "erase", and "read".

FIG. 25 is an equivalent circuit diagram of the memory cell MC of the nonvolatile memory. FIG. 26 is a table showing an example of a condition of voltage application to each part of a selected memory cell in "write", "erase", and "read". The table of FIG. 26 shows a voltage Vmg applied to the memory gate electrode MG (see FIG. 4), a voltage Vs applied to the source region, a voltage Vcg applied to the control gate electrode CG (see FIG. 4), and a voltage Vd applied to the drain region of the memory cell (selected memory cell) MC shown in FIG. 25, and a voltage Vb applied to the p-type well PW (see FIG. 4) for each of "write", "erase", and "read". The table shown in FIG. 26 is a preferred, but not limitative, example of the voltage application condition, and can be variously modified or altered as necessary. In the first embodiment, injection of electrons into the silicon nitride film NF (see FIG. 4), which is a charge storage part of the ONO film ON of the memory transistor, is defined as "write", and injection of holes thereinto is defined as "erase".

Write methods may include a write method called source side injection (SSI) method (hot electron injection write method), in which hot electrons are injected through source side injection to perform write. For example, a voltage as shown in the column of "write" in FIG. 26 is applied to each part of the selected memory cell to be written, and thus electrons are injected into the silicon nitride film NF of the selected memory cell to perform write.

At this time, hot electrons are generated in the channel region (between the source and the drain) below between the two gate electrodes (the memory gate electrode MG and the control gate electrode CG), and the hot electrons are injected into the silicon nitride film NF as a charge storage part under the memory gate electrode MG. The injected hot electrons (electrons) are trapped in trap levels in the silicon nitride film NF. As a result, the threshold voltage of the memory transistor increases. That is, the memory transistor becomes into a write state.

An erase method (hot hole injection erase method), i.e., a so-called BTBT method, in which erase is performed by hot hole injection through band-to-band tunneling (BTBT), can be used as an erase method. Specifically, erase is performed by injecting holes, which are generated by the band-to-band tunneling phenomenon (BTBT), into the charge storage part (the silicon nitride film NF in the ONO film ON). For example, a voltage as shown in the column of "erase" in FIG. 26 is applied to each part of the selected memory cell to be erased, and holes are generated through the BTBT phenomenon and accelerated by an electric field, thereby the holes are injected into the silicon nitride film NF of the selected memory cell, so that the threshold voltage of the memory transistor is reduced. That is, the memory transistor becomes into an erase state.

For read, for example, a voltage as shown in the column of "read" in FIG. 26 is applied to each part of the selected memory cell to be read. A voltage Vmg applied to the memory gate electrode MG during read is set to a value between the threshold voltage of the memory transistor in a write state and the threshold voltage of the memory transistor in an erase state, thereby the write state can be distinguished from the erase state.

Manufacturing Process of Semiconductor Device

A method of manufacturing the semiconductor device of the first embodiment is now described with reference to FIGS. 7 to 24. FIGS. 7 to 24 are each a sectional view of the semiconductor device of the first embodiment during a formation process of the semiconductor device. FIGS. 7 to 11 each illustrate a section along the Y direction (see FIG. 2). Each of FIGS. 12 to 24 illustrates a section along the X direction (see FIG. 2) on its left side and a section along the Y direction on its right side as with FIG. 4. Although the side face of each fin is vertically shown in the drawings, the side face of the fin may be tapered with respect to the main surface of the semiconductor substrate.

First, as illustrated in FIG. 7, the semiconductor substrate SB is provided, and an insulating film IF1, an insulating film IF2, and a semiconductor film SI1 are formed in order on the main surface of the semiconductor substrate SB. The semiconductor substrate SB is made of p-type single-crystal silicon having a specific resistance of about 1 to 10 Ωcm, for example. The insulating film IF1 includes, for example, a silicon oxide film, and can be formed by an oxidation process or a chemical vapor deposition (CVD) process, for example. The insulating film IF1 has a thickness of about 2 to 10 nm. The insulating film IF2 includes, for example, a silicon nitride film, and has a thickness of about 20 to 100 nm. The insulating film IF2 is formed by a CVD process, for example. The semiconductor film SI1 includes, for example, a silicon film, and is formed by a CVD process, for example. The semiconductor film SI1 has a thickness of 20 to 200 nm, for example.

Subsequently, the semiconductor film SI1 is processed using a photolithography technique and an etching process. Consequently, a plurality of patterns of the semiconductor film SI1 extending in the X direction are formed side by side in the Y direction on the insulating film IF2. FIG. 7 is a sectional view including the patterns of the semiconductor film SI1 along a short side direction of each pattern of the semiconductor film SI1.

Subsequently, as illustrated in FIG. 8, a hard mask HM1 is formed so as to cover the side faces of the semiconductor films SI1. For example, a silicon oxide film having a thickness of 10 to 40 nm is formed on the semiconductor substrate SB by a CVD process, and is then subjected to dry etching being anisotropic etching. As a result, the tops of the insulating film IF2 and the semiconductor film SI1 are exposed to form the hard mask HM1 including the silicon oxide film remaining on the side faces of the semiconductor films SI1. The hard mask HM1 does not completely fill the spaces between the adjacent semiconductor films SI1. The hard mask HM1 is annularly formed so as to enclose each semiconductor film SI1.

Subsequently, the semiconductor films SI1 are removed by a wet etching process. Subsequently, part of the hard mask HM1 is removed using a photolithography technique and an etching process. Specifically, portions of the hard mask HM1, which extend in the X direction, are left while other portions, i.e., portions extending in the Y direction are removed. Consequently, the hard mask HM1 does not have the annular structure, and has only patterns extending in the X direction. Specifically, a plurality of hard masks HM1 as patterns extending in the X direction are arranged side by side in the Y direction on the insulating film IF2.

Figure 9:
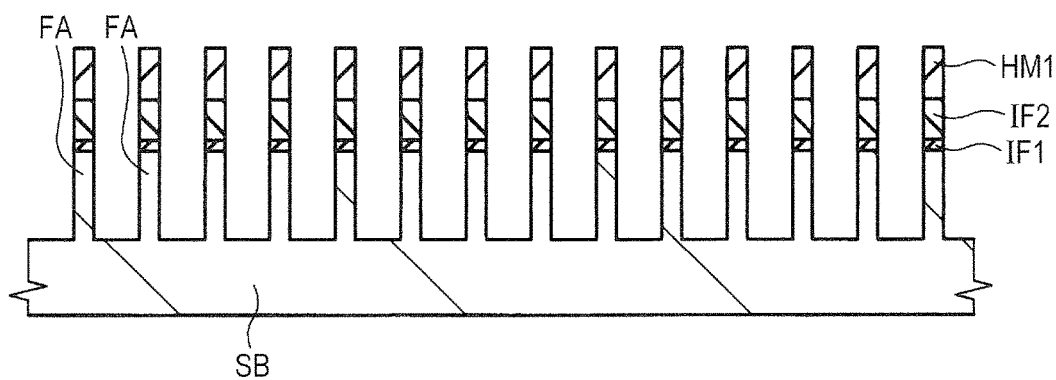
FIG. 9 is a sectional view of the semiconductor device during the manufacturing process following FIG. 8.

Subsequently, as illustrated in FIG. 9, the insulating films IF2 and IF1 and the semiconductor substrate SB are subjected to anisotropic dry etching using the hard masks HM1 as a mask. Thus, plate-like (wall-like) patterns as part of the semiconductor substrate SB i.e., the fins FA, are formed directly under the hard masks HM1 through processing of the semiconductor substrate SB. The semiconductor substrate SB in a region exposed from the hard masks HM1 is dug from its main surface by 100 to 250 nm, thereby the fins FA, each of which has a height of 100 to 250 nm from the main surface of the semiconductor substrate SB, can be formed.

Figure 10:
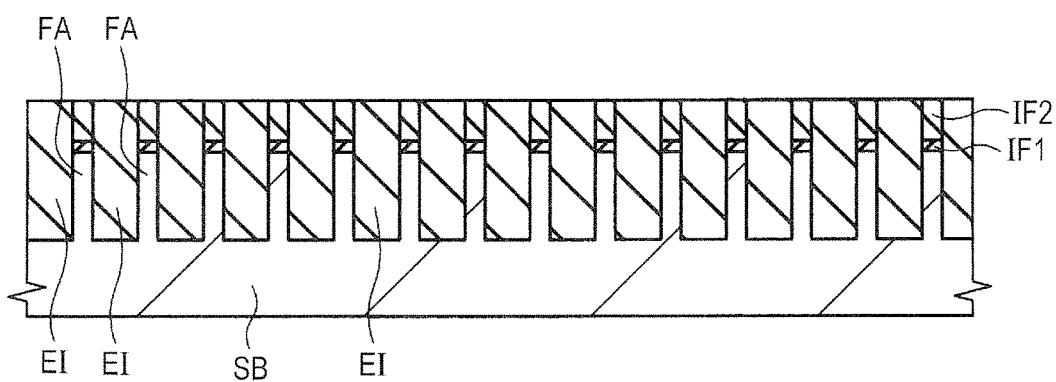
FIG. 10 is a sectional view of the semiconductor device during the manufacturing process following FIG. 9.

Subsequently, as illustrated in FIG. 10, an insulating film including a silicon oxide film or the like is deposited on the semiconductor substrate SB so as to completely cover the fin FA and the insulating films IF1 and IF2. Subsequently, the insulating film is polished by a chemical mechanical polishing (CMP) process to expose the top of the insulating film IF2. This results in formation of the element isolation film EI including the insulating film. The hard masks HM1 are removed by the CMP step. The hard masks HM1 may be removed before forming the insulating film to be the element isolation film EI.

Figure 11:
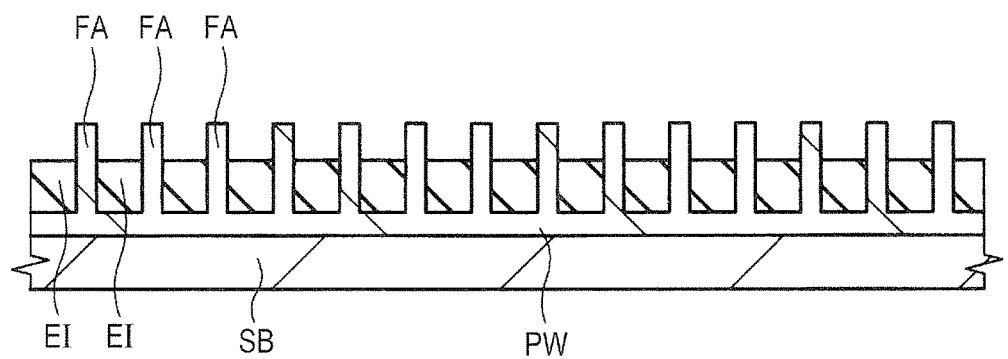
FIG. 11 is a sectional view of the semiconductor device during the manufacturing process following FIG. 10.

Subsequently, as illustrated in FIG. 11, the insulating films IF1 and IF2 are removed. Subsequently, the top of the element isolation film EI is etched so as to be retracted (lowered) in a direction perpendicular to the main surface of the semiconductor substrate SB. This results in exposure of part of each of side faces and the tops of the fins FA.

Subsequently, an impurity is introduced into the main surface of the semiconductor substrate SB by an ion implantation process, thereby a p-type well PW is formed in the fin FA. The p-type well PW is formed by implanting a p-type impurity (for example, boron (B)). The p-type well PW is formed while being spread over the entire inside of the fin FA and over part of the semiconductor substrate SB under the fin FA.

Figure 12:
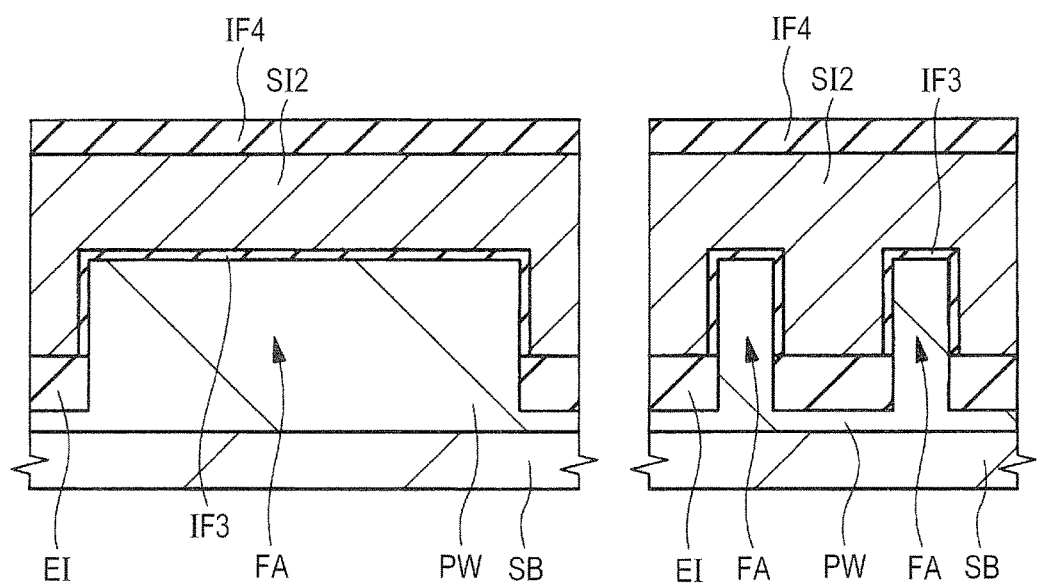
FIG. 12 is a sectional view of the semiconductor device during the manufacturing process following FIG. 11.

Subsequently, as illustrated in FIG. 12, an insulating film IF3 is formed so as to cover the tops and the side faces of the fins FA. The insulating film IF3 can be formed by, for example, a thermal oxidation process, and includes a silicon oxide film having a thickness of about 2 nm, for example. The insulating film IF3 is not formed on the top of the element isolation film EI. Subsequently, a semiconductor film SI2 having a thickness equal to or greater than the height of each fin FA is deposited on the insulating film IF3 by a CVD process or the like, and the top of the semiconductor film SI2 is planarized by a CMP process or the like, thereby the semiconductor film SI2 having a flat top is formed.

Subsequently, an insulating film IF4 is formed on the semiconductor film SI2 by a CVD process, for example. The semiconductor film SI2 includes, for example, a polysilicon film (silicon film), and the insulating film IF4 includes, for example, a silicon nitride film. The semiconductor film SI2 remains on the tops of the fins FA even after the polishing step is performed on the semiconductor film SI2 by the CMP process as described above.

Figure 13:
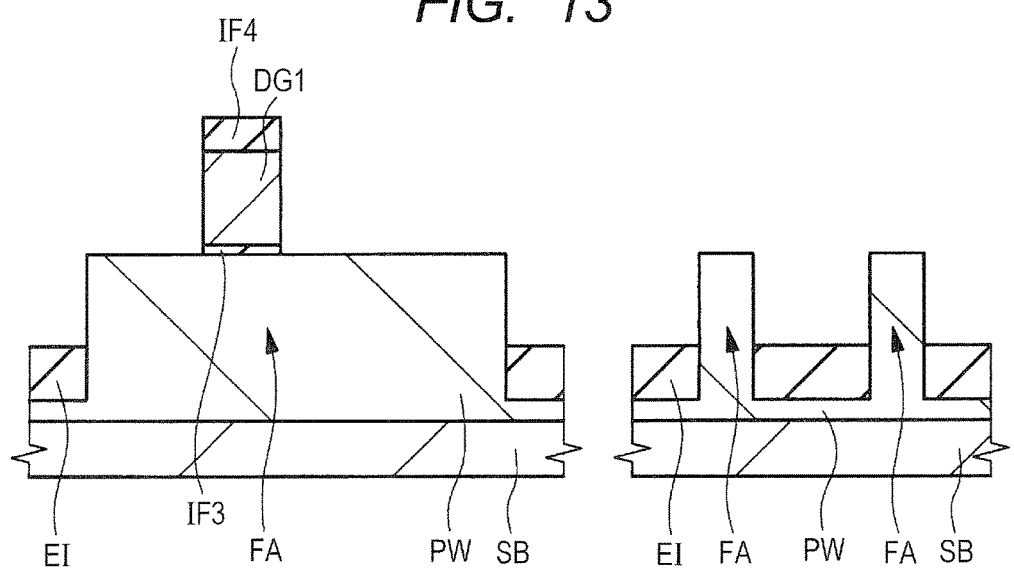
FIG. 13 is a sectional view of the semiconductor device during the manufacturing process following FIG. 12.

Subsequently, as illustrated in FIG. 13, an undepicted photoresist film is formed so as to cover directly over part of the fin FA. The photoresist film includes a resist pattern that extends in the Y direction so as to cover part of each of the fins FA arranged in the Y direction (depth direction in the drawing). The top of the fin FA is exposed from the photoresist film in a region beside the resist pattern.

Subsequently, part of the insulating film IF4 and part of the semiconductor film SI2 are removed by etching using the photoresist film as a mask to expose the top of the element isolation film EI and the surface of the insulating film IF3. Specifically, part of the top and part of the side face of the fin FA is exposed from the insulating film IF4 and the semiconductor film SI2. Consequently, a dummy gate electrode DG1 including the semiconductor film SI2 is formed on the fin FA. The dummy gate electrode DG1 is a pseudo gate electrode that is removed later and replaced with a control gate electrode.

Although it is described that the insulating film IF3 covering the surface of the fin FA exposed from the dummy gate electrode DG1 is removed by the above-described etching and a subsequent cleaning step to expose the surface of the fin FA, the top and the side faces of the fin FA may be still covered with the insulating film IF3.

Figure 14:
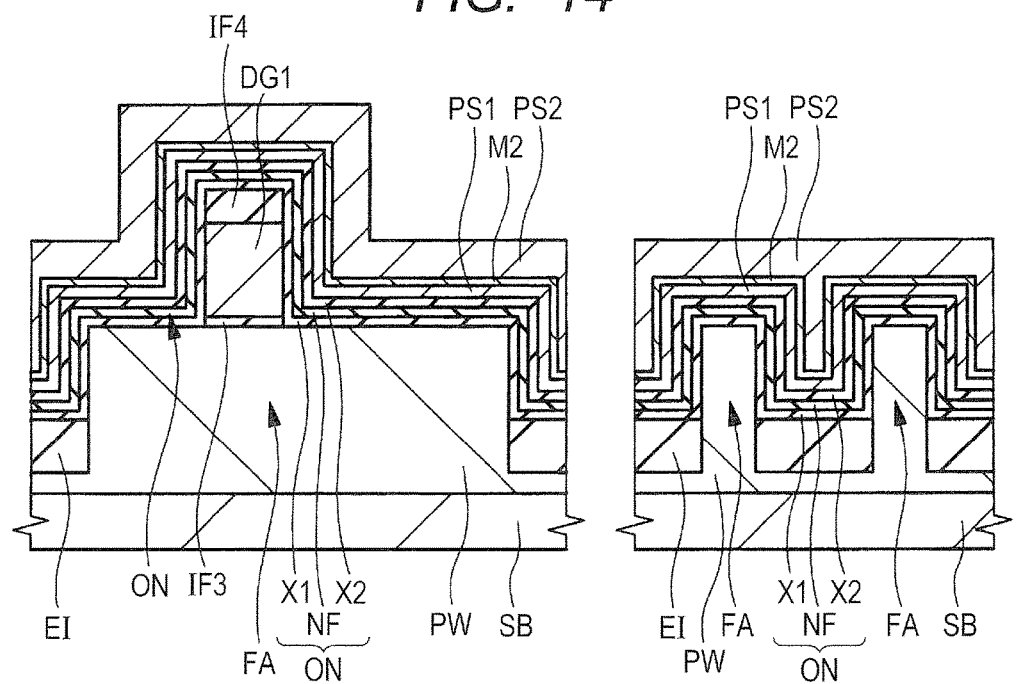
FIG. 14 is a sectional view of the semiconductor device during the manufacturing process following FIG. 13.

Subsequently, as illustrated in FIG. 14, a silicon oxide film (bottom oxide film) X1, a silicon nitride film NF, and a silicon oxide film (top oxide film) X2 are formed in order on the semiconductor substrate SB, thereby the ONO film ON having a stacked structure including the silicon oxide film X1, the silicon nitride film NF, and the silicon oxide film X2 is formed. That is, the ONO film ON is a stacked insulating film. The silicon oxide film X1 can be formed by an oxidation process, a CVD process, or the like. The silicon nitride film NF and the silicon oxide film X2 are formed (deposited) by a CVD process, for example. The silicon oxide film X1 has a thickness of, for example, 4 nm, the silicon nitride film NF has a thickness of, for example, 7 nm, and the silicon oxide film X2 has a thickness of, for example, 9 nm.

The ONO film ON covers the top of the element isolation film EI as well as the top and the side face of the fin FA. The ONO film ON covers the top and the side face of the stacked pattern including the dummy gate electrode DG1 and the insulating film IF4. Although the silicon nitride film NF serves as a charge storage part (charge storage film) of a memory cell to be formed later, a high-k film including HfSiO or the like may be formed instead of the silicon nitride film NF. An aluminum oxide (AlO) film may be formed instead of the silicon oxide film X2.

Subsequently, the polysilicon film PS1, the metal film M2, and the polysilicon film PS2 are formed in order on the ONO film ON. The polysilicon film PS1 has a thickness of, for example, 10 nm, the metal film M2 has a thickness of, for example, 5 nm, and the polysilicon film PS2 has a thickness of, for example, 200 nm. Subsequently, the top of the polysilicon film PS2 is planarized by a CMP process, for example. However, the metal film M2 is not exposed from the polysilicon film PS2 in the planarization step. Hence, the polysilicon film PS2 is provided on the fin FA with the ONO film ON, the polysilicon film PS1, and the metal film M2 in between.

At this time, a region between the fins FA adjacent to each other in the Y direction, i.e., the trench over the element isolation film EI is completely filled with the ONO film ON, the polysilicon film PS1, the metal film M2, and the polysilicon film PS2. The polysilicon films PS1 and PS2 can each be formed by a CVD process. The metal film M2 can be formed by a sputtering process, for example.

A material having heat resistance and a relatively low reactivity with silicon is used as a material of the metal film M2. Specifically, a titanium nitride (TiN) film, a tantalum nitride (TaN) film, or a tungsten nitride (WN) film, which has a lower reactivity with silicon than the aluminum (Al) film or the tungsten (W) film, is used as the metal film M2. This prevents the metal film M2 from reacting with the polysilicon film PS1 or PS2.

Figure 15:
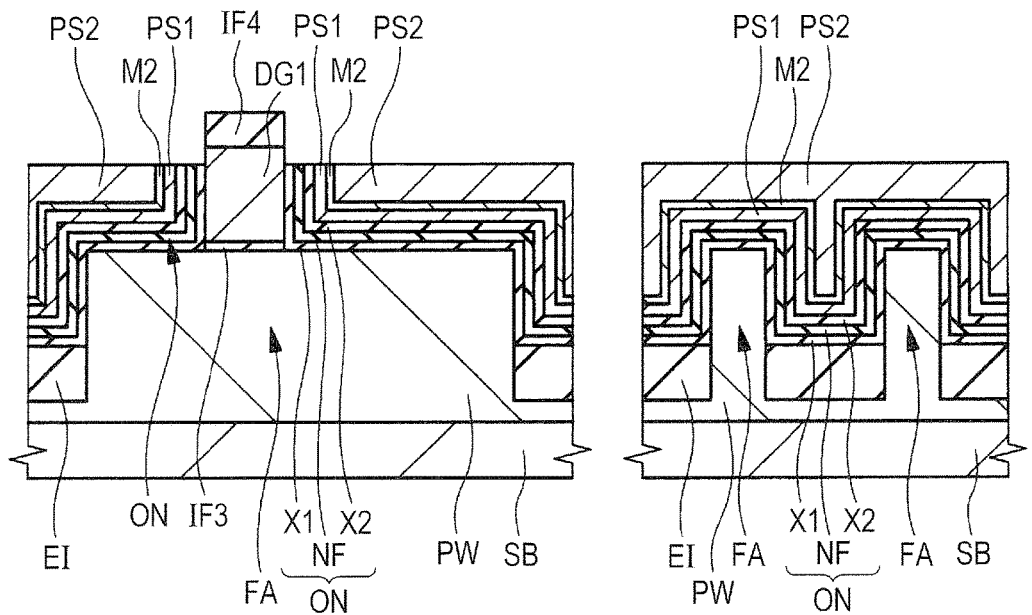
FIG. 15 is a sectional view of the semiconductor device during the manufacturing process following FIG. 14.

Subsequently, as illustrated in FIG. 15, the tops of the ONO film ON, the polysilicon film PS1, the metal film M2, and the polysilicon film PS2 are retracted by an etch-back step. As a result, each of the tops of the ONO film ON, the polysilicon film PS1, the metal film M2, and the polysilicon film PS2 is located at a position below the top of the dummy gate electrode DG1 and above the top of the metal film M2 along the top of the fin FA, for example. In addition, the tops of the ONO film ON, the polysilicon film PS1, the metal film M2, and the polysilicon film PS2 are located at the same height, and exist in substantially the same plane. Consequently, the entire insulating film IF4 and the upper end of the dummy gate electrode DG1 are exposed from the ONO film ON, the polysilicon film PS1, the metal film M2, and the polysilicon film PS2.

Figure 16:
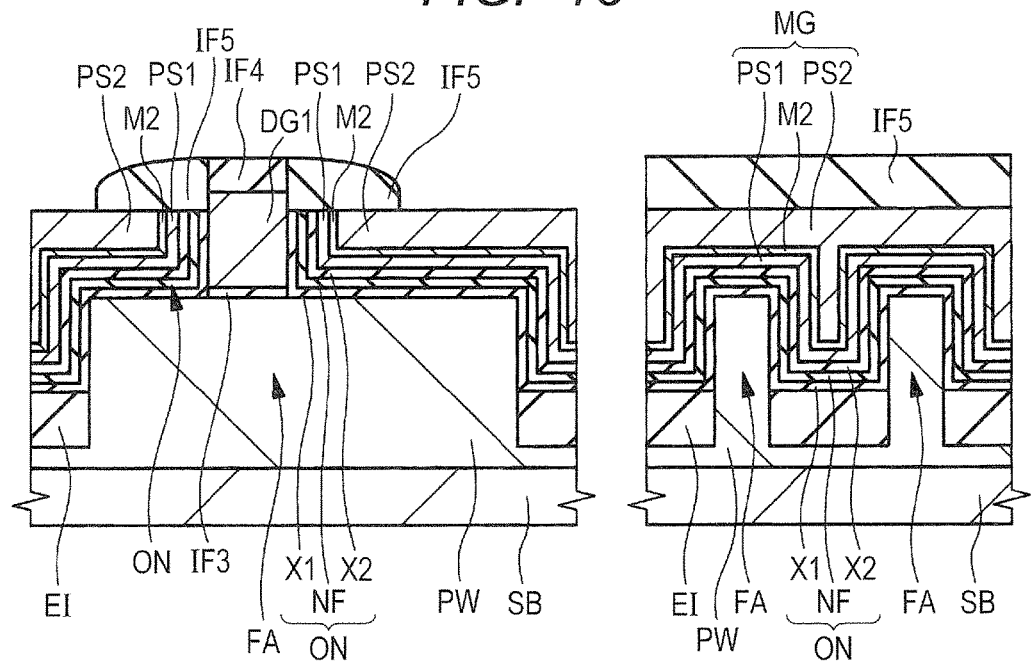
FIG. 16 is a sectional view of the semiconductor device during the manufacturing process following FIG. 15.

Subsequently, as illustrated in FIG. 16, an insulating film IF5 is formed over the semiconductor substrate SB by a CVD process, for example. The insulating film IF5 includes, for example, a silicon nitride film. The insulating film IF5 covers the side faces and the top of the insulating film IF4, the upper ends of the side faces of the dummy gate electrode DG1, and the tops of the ONO film ON, the polysilicon film PS1, the metal film M2, and the polysilicon film PS2.

Subsequently, part of the insulating film IF5 is removed by dry etching to expose the top of the insulating film IF4 and part of the top of the polysilicon film PS2. That is, the insulating film IF5 remains on the side faces of the insulating film IF4 in a sidewall shape. The bottom of the sidewall-shaped insulating film IF5 is in contact with the tops of the ONO film ON, the polysilicon film PS1, the metal film M2, and the polysilicon film PS2.

Figure 17:
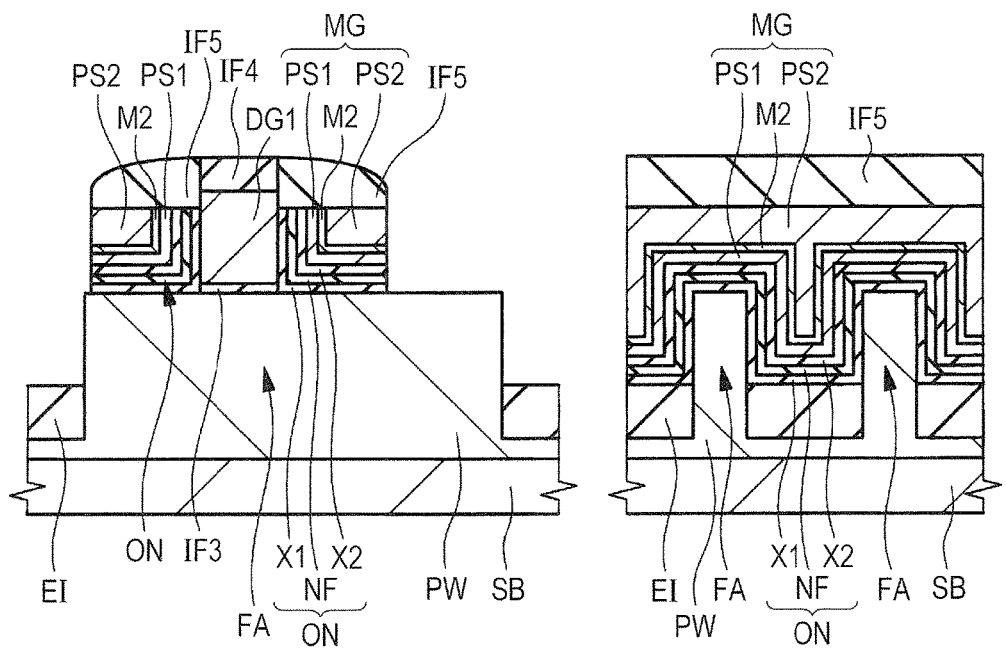
FIG. 17 is a sectional view of the semiconductor device during the manufacturing process following FIG. 16.

Subsequently, as illustrated in FIG. 17, the ONO film ON, the polysilicon film PS1, the metal film M2, and the polysilicon film PS2 are processed by etching using the insulating film IF5 as a mask. Consequently, the ONO film ON, the polysilicon film PS1, the metal film M2, and the polysilicon film PS2 remain in a region close to the side face on either side of the dummy gate electrode DG1. The top of the fin FA is exposed from the ONO film ON, the polysilicon film PS1, the metal film M2, and the polysilicon film PS2 in any region other than the region close to the side face on either side of the dummy gate electrode DG1.

The polysilicon film PS1, the metal film M2, and the polysilicon film PS2 are close to one side face in the gate length direction (X direction) of the dummy gate electrode DG1 with the ONO film ON in between, and collectively configure the memory gate electrode MG. The memory gate electrode MG extends in the Y direction so as to straddle the fins FA in parallel with the dummy gate electrode DG1.

Figure 18:
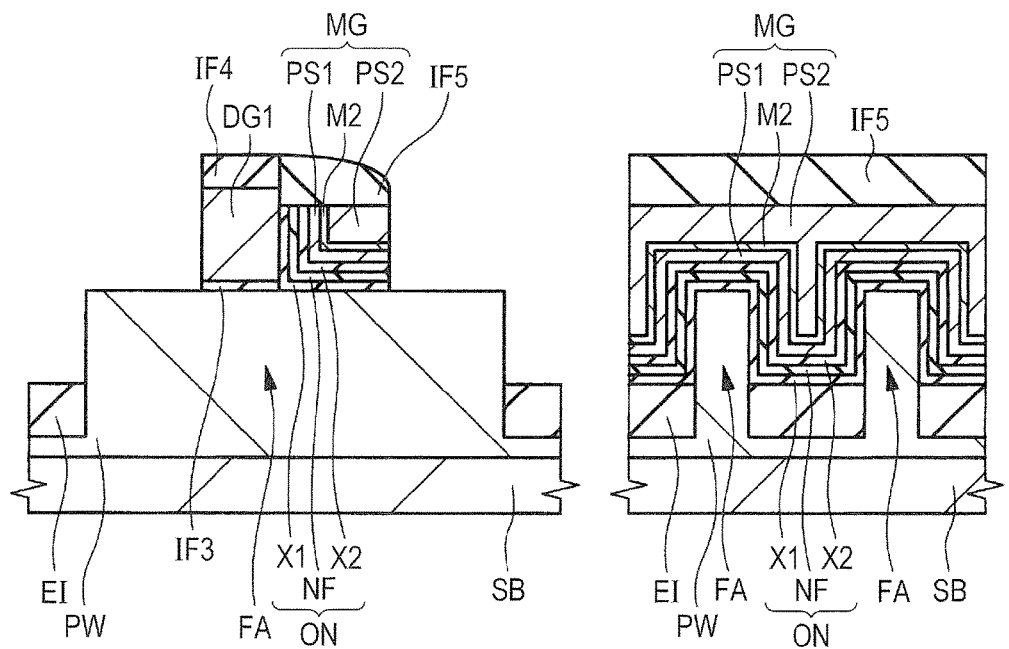
FIG. 18 is a sectional view of the semiconductor device during the manufacturing process following FIG. 17.

Subsequently, as illustrated in FIG. 18, an undepicted resist pattern, which covers the memory gate electrode MG and the insulating film IF5 directly over the memory gate electrode MG, is formed, and then the insulating film IF5, the ONO film ON, the polysilicon film PS1, the metal film M2, and the polysilicon film PS2 exposed from the resist pattern are removed by etching using the resist pattern as a mask. Consequently, the memory gate electrode MG remains in the gate length direction on one side face of the dummy gate electrode DG1 with the ONO film ON in between, and the other side face of the dummy gate electrode DG1 is exposed from the ONO film ON, the polysilicon film PS1, the metal film M2, and the polysilicon film PS2.

Figure 19:
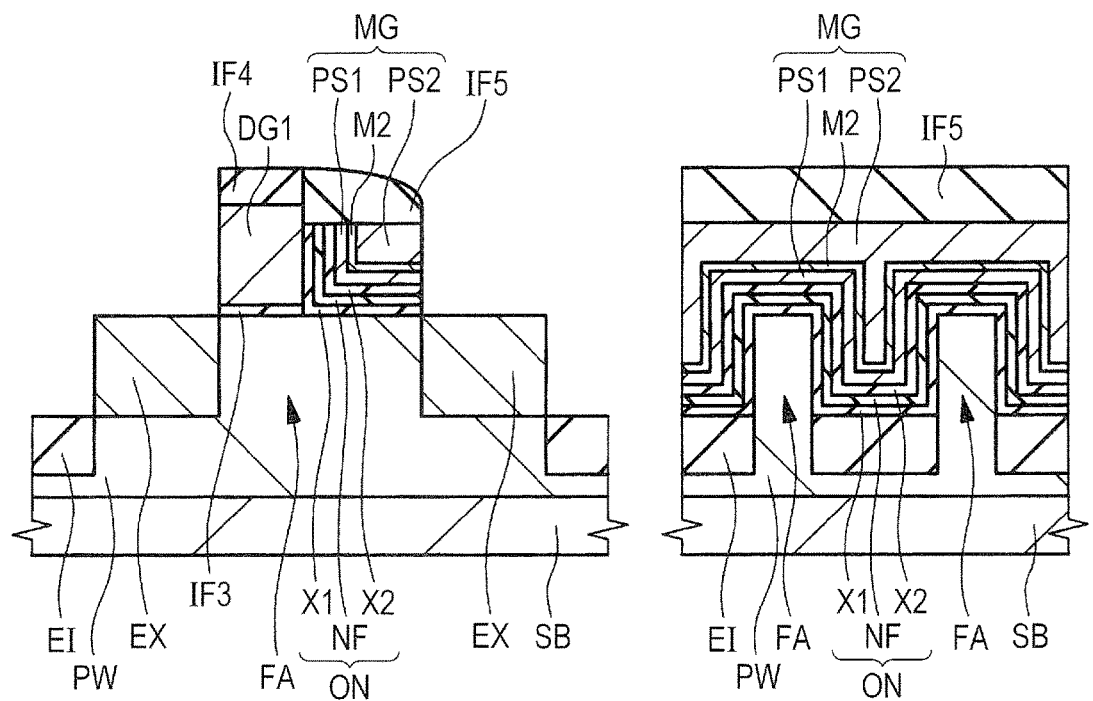
FIG. 19 is a sectional view of the semiconductor device during the manufacturing process following FIG. 18.

Subsequently, as illustrated in FIG. 19, the insulating films IF4 and IF5 and the dummy gate electrode DG1 are collectively used as a mask to perform ion implantation on the top of the fin FA. Consequently, a pair of extension regions EX being n-type semiconductor regions are formed in the top of the fin FA. The extension region EX can be formed by implanting an n-type impurity (for example, arsenic (As)).

Subsequently, an insulating film is formed over the semiconductor substrate SB by a CVD process, for example. The insulating film mainly includes, for example, a silicon nitride film. The insulating film covers the surfaces of the element isolation film EI, the fin FA, the dummy gate electrode DG1, the memory gate electrode MG, and the insulating films IF4 and IF5.

Figure 20:
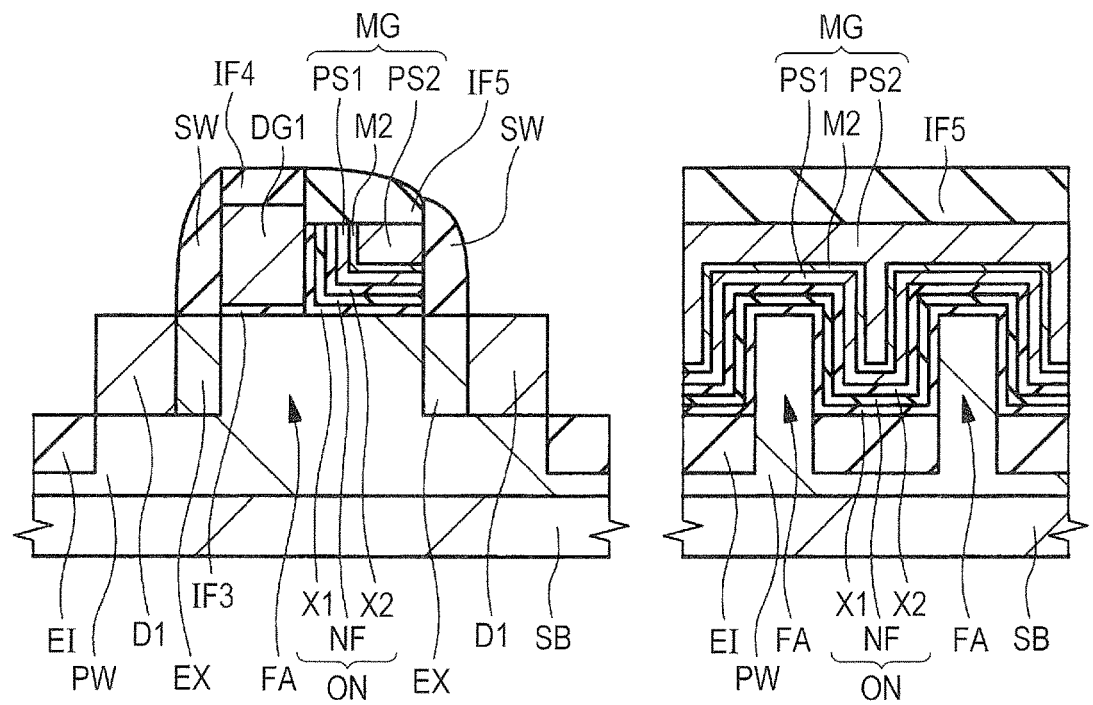
FIG. 20 is a sectional view of the semiconductor device during the manufacturing process following FIG. 19.

Subsequently, as illustrated in FIG. 20, dry etching is performed to remove part of the insulating film, thereby the tops of the element isolation film EI, the fin FA, and the insulating films IF4 and IF5 are exposed. The sidewall SW including the insulating film is thus formed on the side face of a pattern including the dummy gate electrode DG1, the memory gate electrode MG, and the insulating films IF4 and IF5.

Subsequently, ion implantation is performed on the top of the fin FA with a mask including the insulating films IF4 and IF5, the dummy gate electrode DG1, and the sidewall SW. An n-type impurity (for example, phosphorus (P) or arsenic (As)) is implanted, thereby a pair of diffusion regions D1 each being an n-type semiconductor region are formed in the top of the fin FA. In the formation step of the diffusion region D1, ion implantation is performed with an impurity concentration higher than that in the ion implantation step for formation of the extension region EX. Subsequently, heat treatment for activation is performed in order to diffuse the impurity in the semiconductor substrate SB. As a result, the impurity contained in the diffusion region D1, the extension region EX, and the like are thermally diffused.

Consequently, the source/drain region including the diffusion regions D1 and the extension regions EX is formed. The source/drain region is formed in the top and the side face of the fin FA exposed from a pattern including the control gate electrode CG and the memory gate electrode MG, i.e., in the surface of the fin FA. The source/drain region and the memory gate electrode MG configure a memory transistor. The memory transistor is a FINFET having a channel including the surface of the fin FA. The surface of the fin FA as referred to herein includes the top and the side face of the fin FA.

Figure 21:
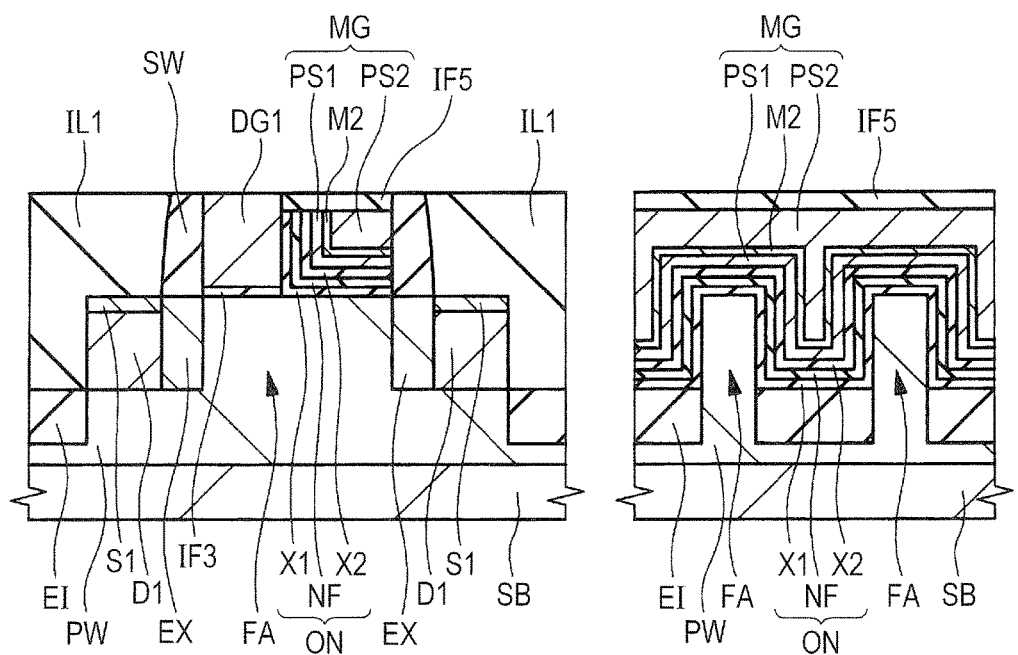
FIG. 21 is a sectional view of the semiconductor device during the manufacturing process following FIG. 20.

Subsequently, as illustrated in FIG. 21, a silicide layer is formed so as to cover the source/drain region using a known salicide (self align silicide) process. First, a metal film is formed so as to cover the fin FA. The metal film includes, for example, a NiPt film deposited by a sputtering process. Subsequently, heat treatment is performed on the semiconductor substrate SB to react the surface of the fin FA with the metal film. This results in formation of the silicide layer S1 including a nickel silicide (NiSi) film covering the top and a side face of the diffusion region D1.

Subsequently, an undepicted liner film including, for example, a silicon nitride film and the interlayer insulating film IL1 including a silicon oxide film are formed in order over the main surface of the semiconductor substrate SB. The liner film and the interlayer insulating film IL1 can be formed by a CVD process, for example. The interlayer insulating film IL1 has a thickness larger than the total height of the height of the fin FA on the element isolation film EI and the height of a stacked body including the dummy gate electrode DG1 and the insulating film IF4. Subsequently, the top of the interlayer insulating film IL1 is planarized using a CMP process, for example.

In this planarization step, the insulating film IF4 is entirely removed, and the insulating film IF5 is partially removed, thereby the top of the dummy gate electrode DG1 is exposed. In the planarization step, however, the tops of the ONO film ON, the polysilicon film PS1, the metal film M2, and the polysilicon film PS2 are not exposed. That is, the tops of the ONO film ON, the polysilicon film PS1, the metal film M2, and the polysilicon film PS2 are still covered with the insulating film IF5 even after the planarization step.

Figure 22:
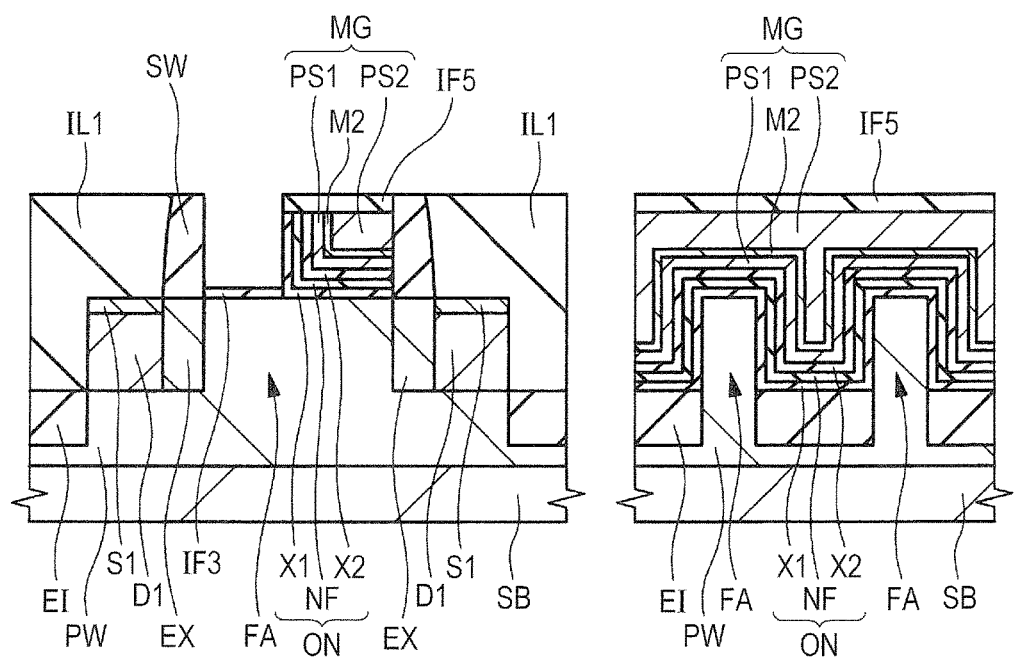
FIG. 22 is a sectional view of the semiconductor device during the manufacturing process following FIG. 21.

Subsequently, as illustrated in FIG. 22, the dummy gate electrode DG1 including a polysilicon film is removed by wet etching, for example. As a result, a trench is formed in a region, from which the dummy gate electrode DG1 is removed, on the directly over the insulating film IF3.

While the silicon film is selectively removed in this step, the polysilicon films PS1 and PS2 are covered with the insulating film IF5 and are thus not removed. Specifically, since the tops of the ONO film ON, the polysilicon film PS1, the metal film M2, and the polysilicon film PS2 are retracted below with respect to the top of the dummy gate electrode DG1 in the etch-back step described with reference to FIG. 15, it is possible to prevent the memory gate electrode MG protected by the insulating film IF5 from being removed by the wet etching.

Figure 23:
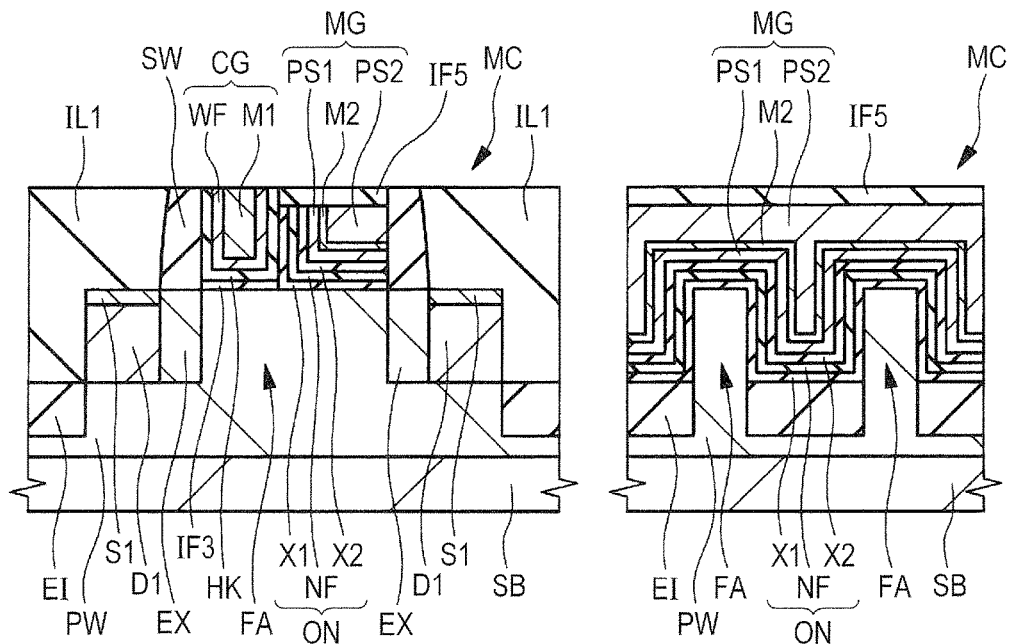
FIG. 23 is a sectional view of the semiconductor device during the manufacturing process following FIG. 22.

Subsequently, as illustrated in FIG. 23, the control gate electrode CG is formed in that trench. Specifically, first, the high dielectric-constant film HK, the metal film WF, and the metal film M1 are formed in order on the interlayer insulating film IL1 including the inside of the trench, thereby the trench is completely filled with the high dielectric-constant film HK, the metal film WF, and the metal film M1. Subsequently, the excess high dielectric-constant film HK, metal film WF, and metal film M1 on the interlayer insulating film IL1 are removed using, for example, a CMP process to expose the top of the interlayer insulating film IL1. Consequently, the high dielectric-constant film HK, the metal film WF, and the metal film M1 are left in the trench.

The insulating film IF3 and the high dielectric-constant film HK configure the gate insulating film. The metal films WF and M1 configure the control gate electrode CG. The control gate electrode CG and the source/drain region configure the control transistor. The control transistor and the memory transistor configure the memory cell MC. The control transistor is a FINFET having a channel including the surface of the fin FA. The surface of the fin FA as referred to herein includes the top and the side faces of the fin FA.

Figure 24:
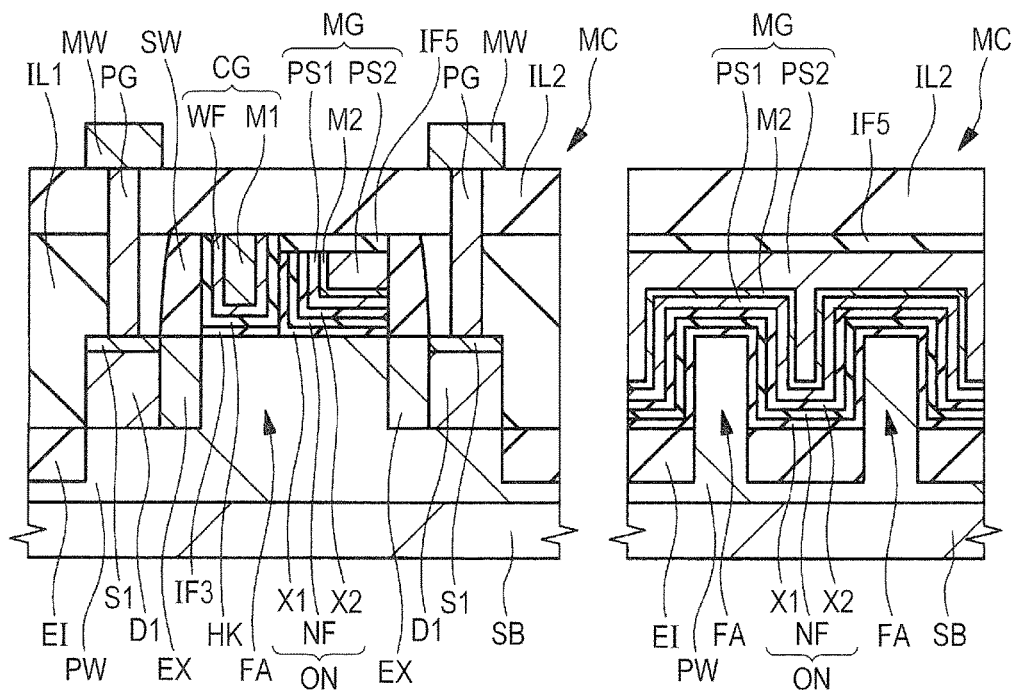
FIG. 24 is a sectional view of the semiconductor device during the manufacturing process following FIG. 23.

Subsequently, as illustrated in FIG. 24, a plurality of contact holes penetrating through the interlayer insulating films IL1 and IL2 are formed by a photolithography technique and a dry etching process. The top of the silicide layer S1 directly over the source/drain region is partially exposed on the bottom of the contact hole. Contact holes are formed in undepicted regions so as to partially expose the respective tops of the control gate electrode CG and the memory gate electrode MG.

Subsequently, a conductive plug PG mainly made of tungsten (W) or the like is formed as a coupling conductive component in the contact hole CH. The plug PG has a stacked structure of a barrier conductor film (for example, a titanium film, a titanium nitride film, or a stacked film thereof) and a main conductor film (for example, tungsten film) located on the barrier conductor film. The plug PG is electrically coupled to each of the source and drain regions of the memory cell MC via the silicide layer S1.

Subsequently, the interconnections MW are formed on the interlayer insulating film IL2. Each interconnection MW includes a stacked structure of a barrier conductor film (for example, a titanium nitride film, a tantalum film, or a tantalum nitride film) and a main conductor film (copper film) formed on the barrier conductor film. In FIG. 24, the barrier conductor film and the main conductor film forming the interconnection MW are shown in an integrated manner for simplification of the drawing. The same point is valid with regard to the plug PG. The semiconductor device of the first embodiment is substantially completed through the above-described steps.

The interconnection MW can be formed by, for example, a so-called single damascene process. Specifically, an interlayer insulating film having an interconnection trench is formed on the interlayer insulating film IL2, and a metal film is embedded in the interconnection trench, thereby the interconnection MW can be formed. In the drawing, however, the interlayer insulating film beside the interconnection MW is omitted.

Effects of First Embodiment

Figure 33:
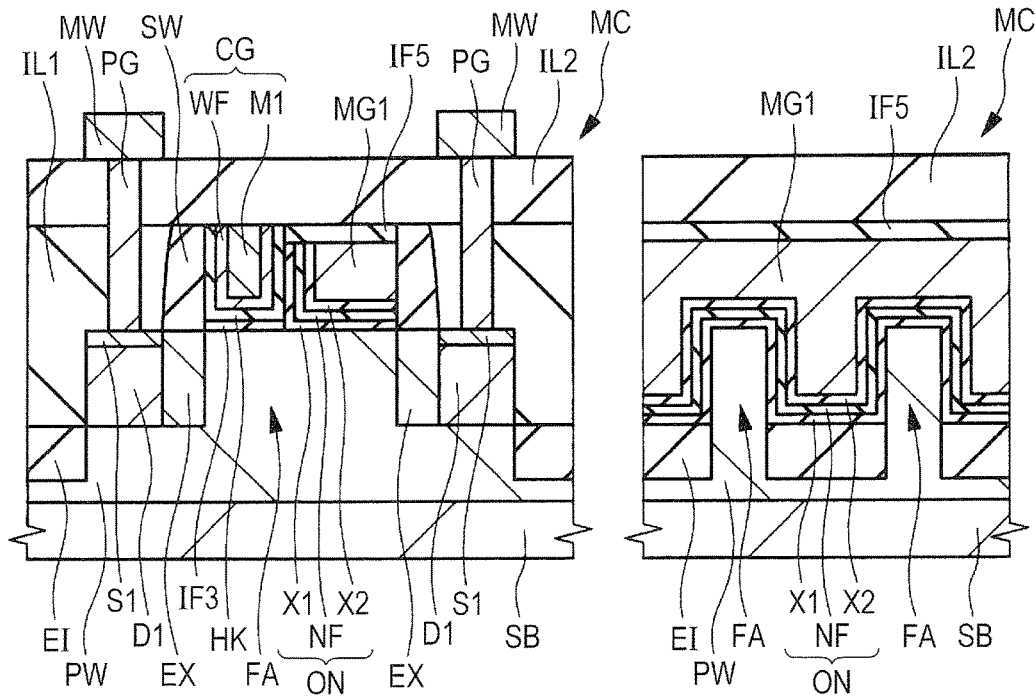
FIG. 33 is a sectional view of a semiconductor device of a comparative example during a manufacturing process of the semiconductor device.
Figure 34:
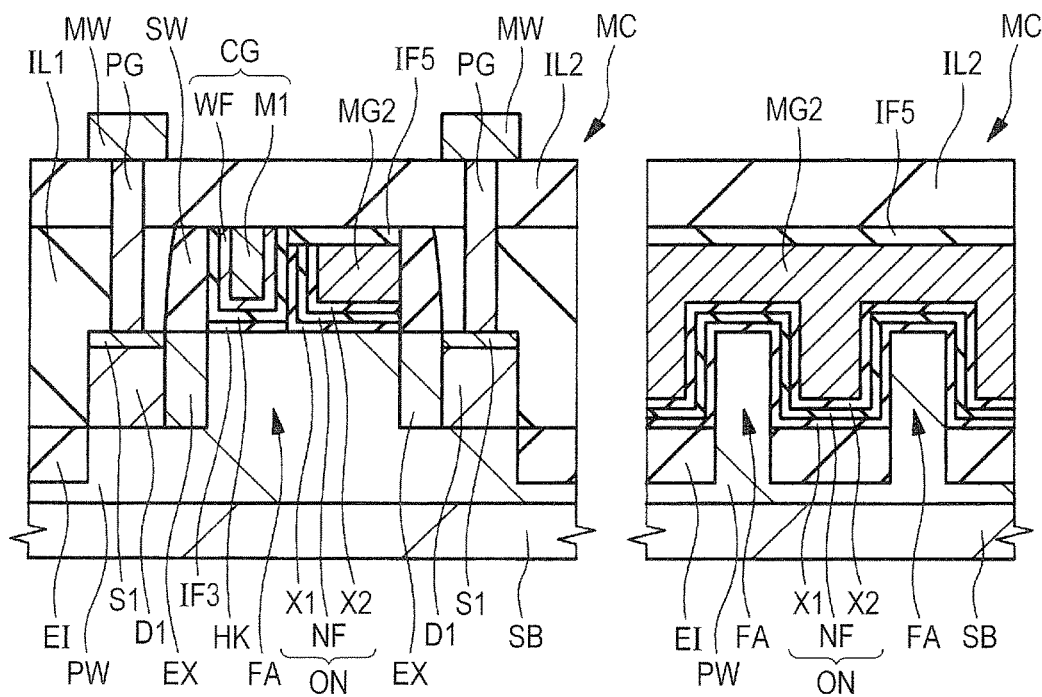
FIG. 34 is a sectional view of a semiconductor device of another comparative example during a manufacturing process of the semiconductor device.
Figure 35:
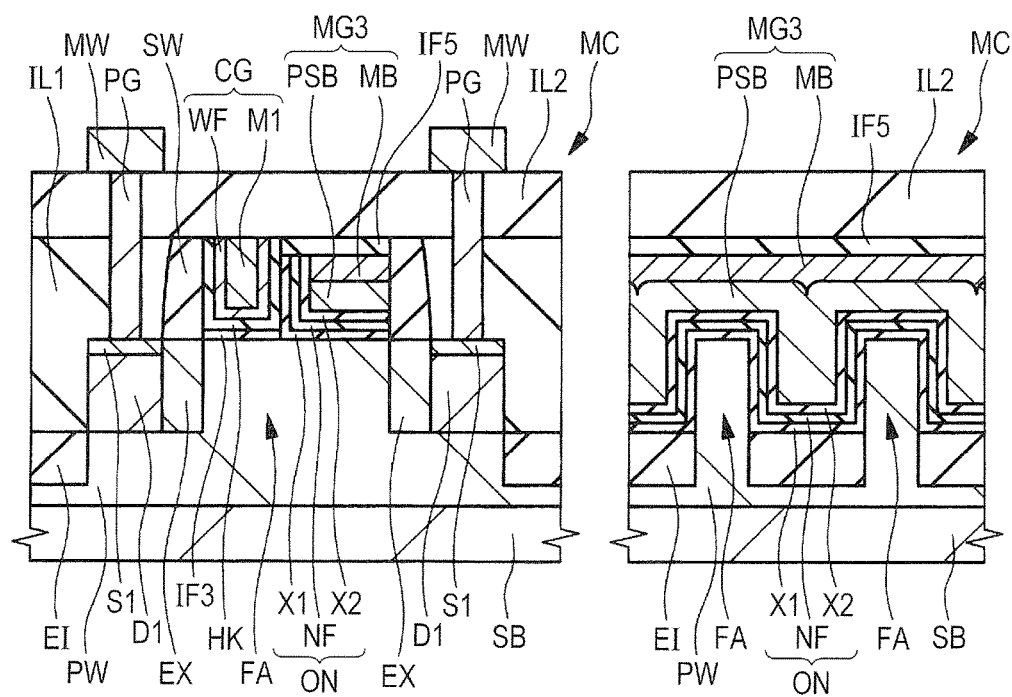
FIG. 35 is a sectional view of a semiconductor device of another comparative example during a manufacturing process of the semiconductor device.

Effects of the semiconductor device of the first embodiment is now described with reference to comparative examples shown in FIGS. 33 to 35. FIGS. 33 to 35 are each a sectional view of a semiconductor device of the comparative example. FIGS. 33 to 35 each illustrate cross sections at positions corresponding to those of the cross sections shown in FIG. 4, which each show a cross section of a memory cell along a longitudinal direction of a fin and a cross section of the memory cell along a lateral direction of the fin.

The semiconductor device of the comparative example shown in FIG. 33 is different from the semiconductor device of the first embodiment in that a memory gate electrode MG1 is entirely formed only of a polysilicon film. The semiconductor device of the comparative example shown in FIG. 34 is different from the semiconductor device of the first embodiment in that a memory gate electrode MG2 is entirely formed of a metal film (for example, aluminum (Al) or tungsten (W) film). Although the semiconductor device of the comparative example shown in FIG. 35 includes a memory gate electrode MG3 formed of a polysilicon film PSB and a metal film MB on the polysilicon film PSB, the semiconductor device is different from the semiconductor device of the first embodiment in that the polysilicon film PSB has a large thickness, and completely fills a space between two adjacent fins FA.

In the semiconductor device shown in FIG. 33, since the memory gate electrode MG1 is formed only of the polysilicon film, the memory gate electrode MG1 disadvantageously has a high resistance value. Even if only the top of the memory gate electrode MG1 is silicided, since the polysilicon film covering the side faces of the fin FA has high resistance, electric potential is slowly propagated to the lower part of the fin FA, leading to a reduction in speed of write or erase.

On the other hand, as illustrated in FIG. 34, when the memory gate electrode MG2 is entirely formed of a metal film, although the memory gate electrode MG2 has a low resistance, an insulating film (for example, a silicon oxide film or an aluminum oxide film) between the silicon nitride film NF as a charge storage film and the memory gate electrode MG2 may react with that metal film, leading to a possibility of formation of a metal oxide film. That is, the silicon oxide film X2 as the top oxide film of the ONO film ON may react with the metal film. In particular, the memory gate electrode MG2 formed of an aluminum film, a tungsten film, or the like easily reacts with the top oxide film. When the top oxide film becomes a metal oxide film in this way, interfacial characteristics between the ONO film ON and the memory gate electrode MG2 are deteriorated as compared with the case where the memory gate electrode is entirely formed of a polysilicon film (see FIG. 33).

In such a case, electrons (charges) injected into the ONO film ON by write operation are disadvantageously captured in an unintended place, or easily escape from the ONO film ON. In other words, write characteristics and charge retention characteristics are deteriorated. Consequently, reliability of the semiconductor device is deteriorated.

On the other hand, in the semiconductor device of the comparative example shown in FIG. 35, part of the memory gate electrode MG3 is formed of the metal film MB, and thus resistance of the memory gate electrode MG3 is reduced. In addition, since the polysilicon film PSB is interposed between the metal film MB and the ONO film ON, it is possible to prevent the top oxide film from reacting with the metal unlike the above-described case.

In the comparative example shown in FIG. 35, however, the metal film MB is not provided between the adjacent fins FA. Hence, electric potential is still slowly propagated to the lower part of the fin FA due to the high resistance of the polysilicon film covering the side faces of the fin FA, and thus write or erase speed is disadvantageously low.

In the first embodiment, therefore, as illustrated in FIG. 4, there is provided the memory gate electrode MG having the thin polysilicon film PS1 formed on the ONO film ON and the metal film M2 on the polysilicon film PS1. Thus, part of the memory gate electrode MG is formed of the metal film M2, thereby the resistance of the memory gate electrode MG is reduced. In addition, since the polysilicon film PS1 is interposed between the metal film M2 and the ONO film ON, it is possible to prevent the top oxide film from reacting with a metal unlike the above-described case.

Furthermore, in the first embodiment, the polysilicon film PS1 as the lowermost layer of the memory gate electrode MG having the stacked structure does not fill the entire trench between the adjacent fins FA, and the metal film M2 is embedded in the trench. Specifically, a low-resistance metal film M2 is provided adjacent to the side face of the fin FA, in which the channel of each of the control transistor and the memory transistor is provided, with the ONO film ON and the polysilicon film PS1 in between. This makes it possible to reduce the resistance of the memory gate electrode MG in the vicinity of the side face of the fin FA. It is therefore possible to prevent the electric potential from being slowly propagated to the lower part of the fin FA. That is, the write operation and the erase operation can be performed at a higher speed than the comparative examples shown in FIGS. 33 and 34.

It is therefore possible to prevent deterioration in reliability of the semiconductor device due to deterioration in interface characteristics between the ONO film ON and the memory gate electrode MG, and to improve performance of the semiconductor device by reducing the resistance of the memory gate electrode MG.

Further, in the first embodiment, one of the conductive films forming the memory gate electrode MG, i.e., the conductive film on the metal film M2 is formed of the polysilicon film PS2, and the silicide layer is not formed in the top of the polysilicon film PS2. Even in such a case, the electric potential supplied to the memory gate electrode MG can be propagated at high speed through the metal film M2. It is therefore possible to sufficiently reduce the resistance of the memory gate electrode MG. If the conductive film on the metal film M2 is silicided, or if the conductive film is formed of a metal film, the number of manufacturing steps is increased, leading to an increase in manufacturing cost. On the other hand, the conductive film on the metal film M2 is formed of the polysilicon film PS2 in the first embodiment, thereby the manufacturing process can be simplified and the manufacturing cost can be reduced.

Further, as described with reference to FIGS. 5 and 6, since the plug PG is directly coupled to the metal film M2 in the power feeding region for the memory gate electrode MG, even if the surface of the polysilicon film PS2 is not silicided, the coupling resistance between the memory gate electrode MG and the plug PG can be reduced.

Modification

Figure 27:
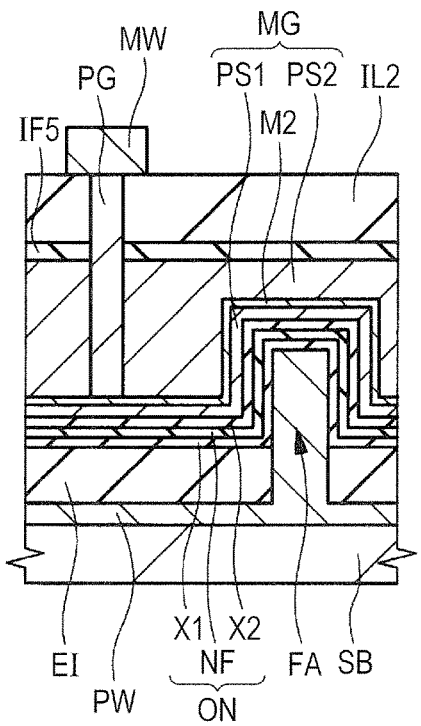
FIG. 27 is a sectional view of a semiconductor device of a modification of the first embodiment of the invention during a manufacturing process of the semiconductor device.

A modification of the semiconductor device of the first embodiment is now described with reference to FIG. 27. FIG. 27 is a sectional view illustrating a semiconductor device as a modification of the first embodiment. FIG. 27 shows a cross section of a power feeding region for the memory gate electrode. FIG. 27 shows a cross section along the lateral direction of the fin. This modification is different from the semiconductor device described with reference to FIGS. 1 to 24 only in the mode of the plug coupled to the memory gate electrode.

As illustrated in FIG. 27, the plug PG used for power feeding to the memory gate electrode MG is not necessary to be coupled to the top of the entire stacked film including the polysilicon film PS1, the metal film M2, and the polysilicon film PS2, and may be coupled to the top of the metal film M2 while penetrating through the polysilicon film PS2. In other words, the plug PG penetrates through the interlayer insulating film IL2 and the polysilicon film PS2, and is coupled to the top of the metal film M2 under the polysilicon film PS2.

The entire bottom of the plug PG is coupled to the top of the metal film M2 extending in the X direction and the Y direction along the main surface of the semiconductor substrate SB and along the top of the element isolation film EI. In such a case, the contact area between the plug PG and the metal film M2 can be increased as compared with the structure shown in FIG. 6. Hence, this modification provides the effects similar to those of the semiconductor device described with reference to FIGS. 1 to 24, and makes it possible to further reduce the coupling resistance between the plug PG and the memory gate electrode MG.

Second Embodiment

Figure 28:
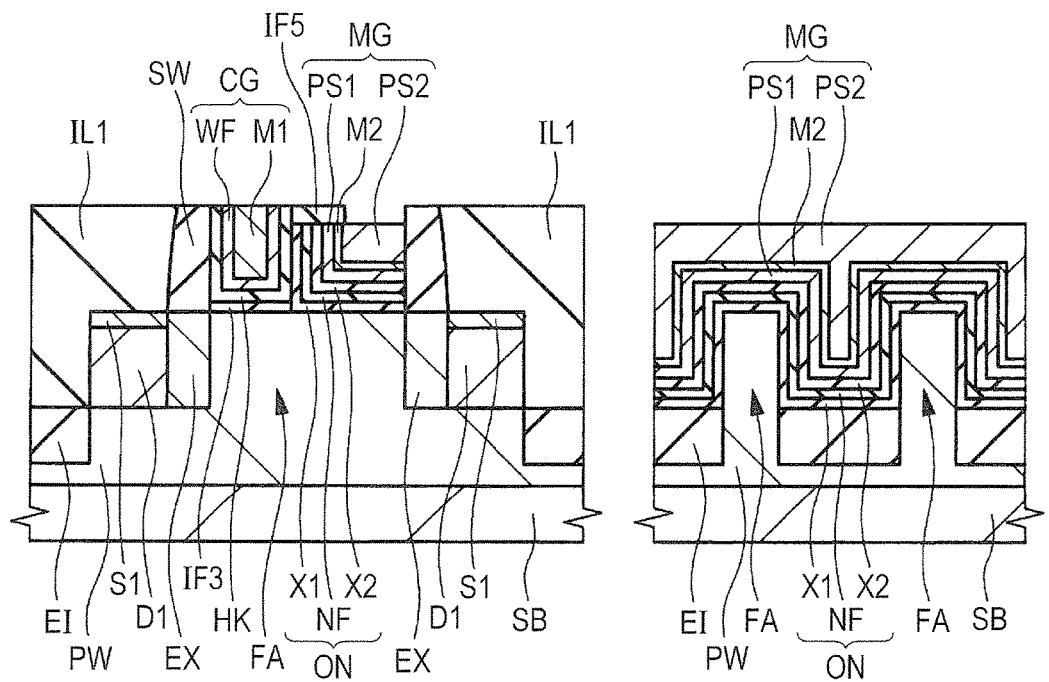
FIG. 28 is a sectional view of a semiconductor device of a second embodiment of the invention during a manufacturing process of the semiconductor device.
Figure 29:
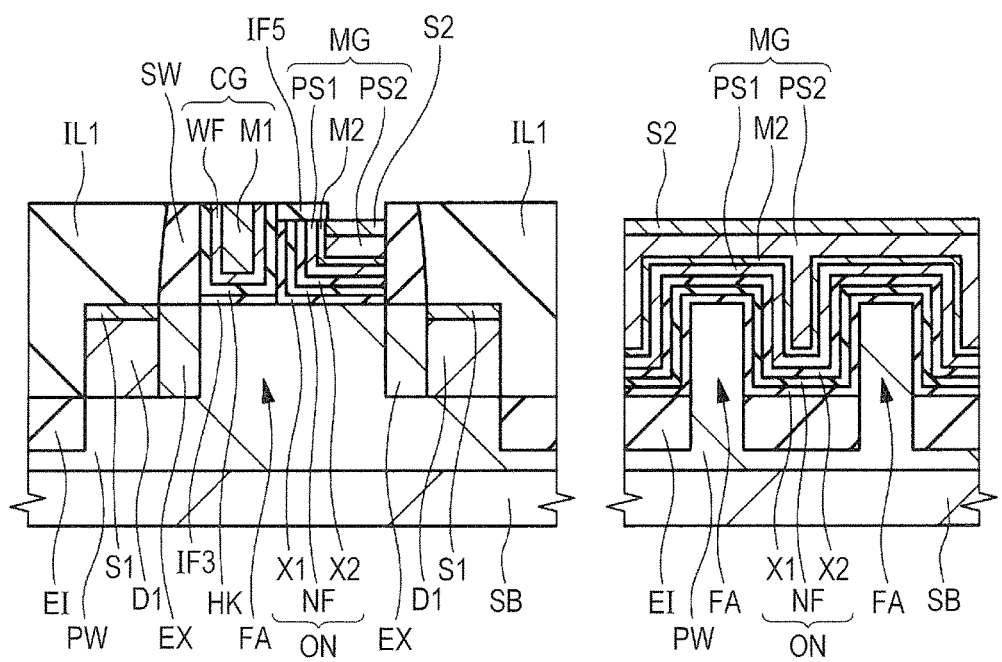
FIG. 29 is a sectional view of the semiconductor device during the manufacturing process following FIG. 28.
Figure 30:
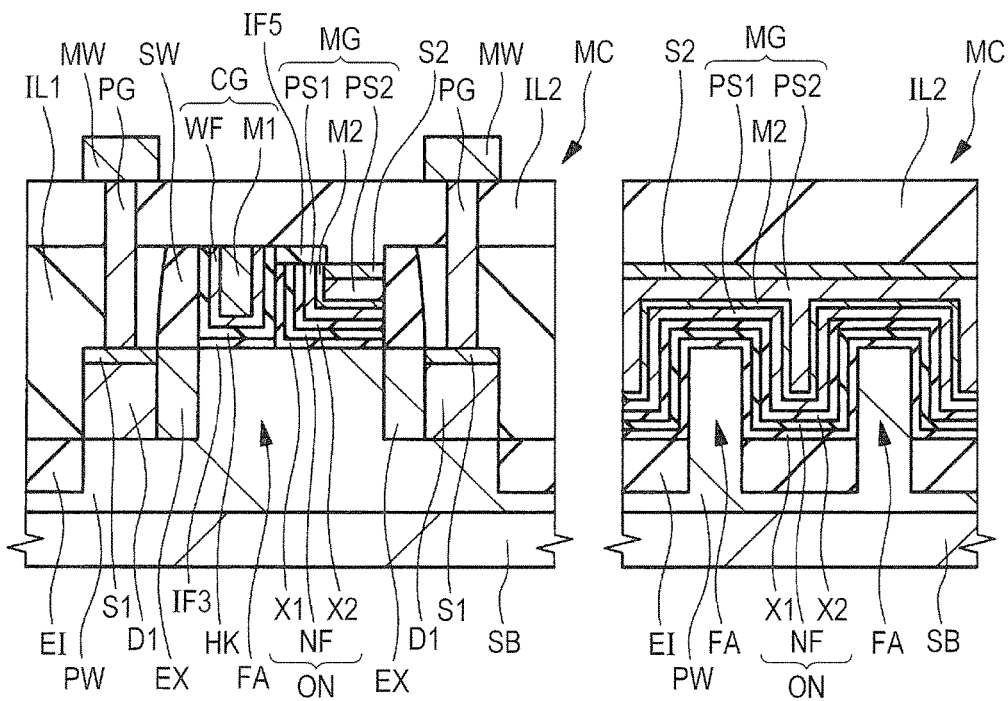
FIG. 30 is a sectional view of the semiconductor device during the manufacturing process following FIG. 29.

The top of the polysilicon film forming the memory gate electrode can also be silicided. A semiconductor device and a method of manufacturing the semiconductor device according to a second embodiment is now described with reference to FIGS. 28 to 30. FIGS. 28 to 30 are each a sectional view of the semiconductor device of the second embodiment during a manufacturing process of the semiconductor device. FIGS. 28 to 30 show respective cross sections at positions corresponding to those of the cross sections shown in FIGS. 12 to 24, which each show a cross section of a memory cell along the longitudinal direction of the fin and a cross section of the memory cell along the lateral direction of the fin. Silicidation of the top of the polysilicon film forming the memory gate electrode is now described.

First, steps similar to those described with reference to FIGS. 7 to 23 are performed. Subsequently, as illustrated in FIG. 28, part of the insulating film IF5 is removed by a photolithography technique and an etching process to expose the top of the polysilicon film PS2. At this time, the metal film M2 is not exposed. Although not shown in the drawing, a protective film covering the top of the control gate electrode CG including the metal films WF and M1 is formed before the insulating film IF5 is partially removed by etching as described above, and while the control gate electrode CG is covered with the protective film, a silicide layer formation step is performed as follows.

Subsequently, as illustrated in FIG. 29, the top of the polysilicon film PS2 is silicided using a known salicide process, thereby a silicide layer S2 covering the top of the polysilicon film PS2 is formed. That is, a metal film covering the top of the polysilicon film PS2 is formed. The metal film includes, for example, a NiPt film deposited by a sputtering process. Subsequently, heat treatment is performed on the semiconductor substrate SB to react the polysilicon film PS2 with the metal film. This results in formation of the silicide layer S2 including a nickel silicide (NiSi) film covering the top of the polysilicon film PS2.

Subsequently, as illustrated in FIG. 30, steps similar to those described with reference to FIG. 24 are performed, thereby the semiconductor device of the second embodiment is substantially completed. Although it has been described that a part of the polysilicon film PS2 is left and the silicide layer S2 is formed on the part of the polysilicon film PS2, the entire thickness of the polysilicon film PS2 may be silicided. That is, the bottom of the silicide layer S2 may be in contact with the top of the metal film M2 as with a metal film M3 shown in FIG. 32 used in later description. In such a case, the silicide layer S2 is embedded between the adjacent fins FA.

In the second embodiment, since the top of the polysilicon film PS2 is silicided, the resistance of the memory gate electrode MG can be reduced as compared with the case where the entire conductive film on the metal film M2 is formed of a polysilicon film. In addition, when the plug is coupled to the memory gate electrode MG in the power feeding region for the memory gate electrode MG, since the plug PG can be coupled to the silicide layer S2, the coupling resistance between the plug PG and the memory gate electrode MG can be reduced.

Hence, it is possible to reduce the resistance of the entire memory gate electrode MG by forming the low-resistance metal film M2 in the vicinity of each side face of the fin FA. Furthermore, performance of the semiconductor device can be improved by performing silicidation of the polysilicon film PS2.

Third Embodiment

Figure 31:
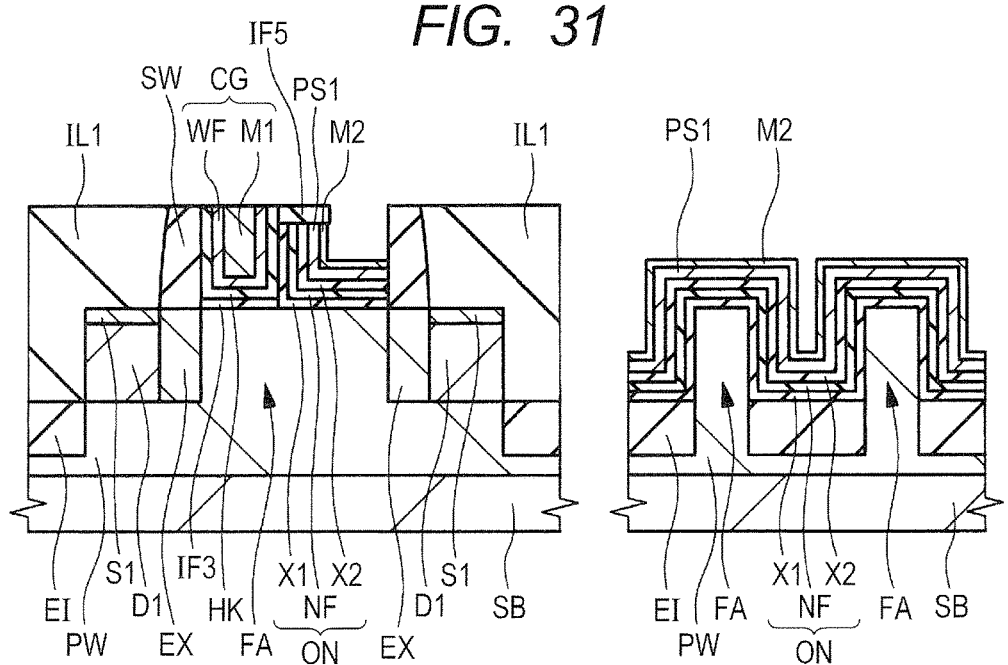
FIG. 31 is a sectional view of a semiconductor device of a third embodiment of the invention during a manufacturing process of the semiconductor device.
Figure 32:
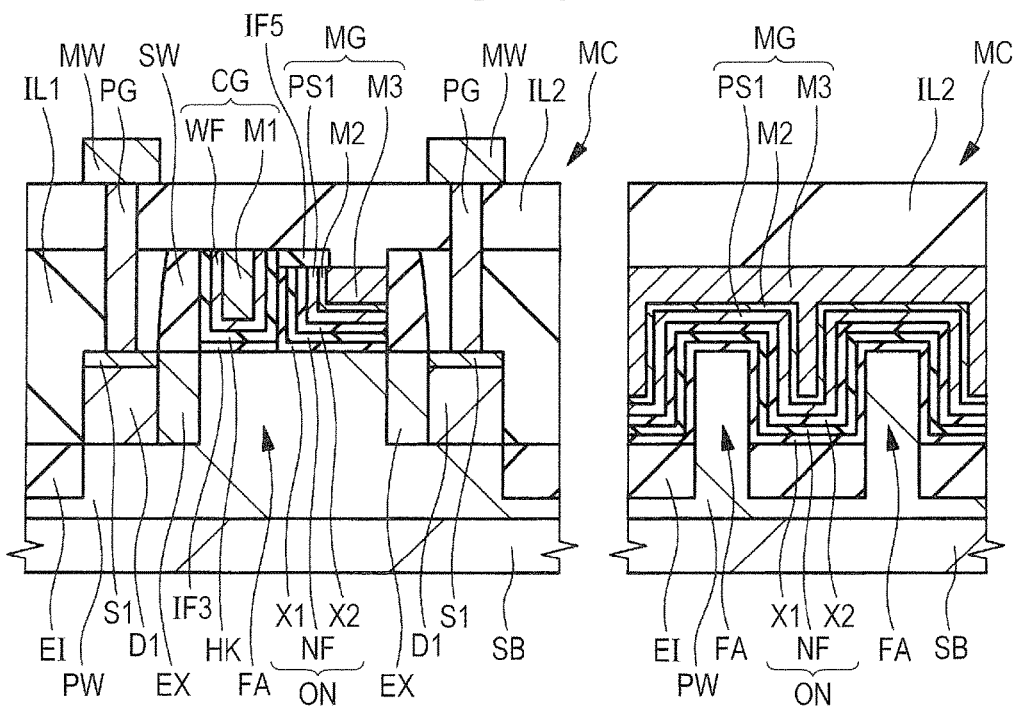
FIG. 32 is a sectional view of the semiconductor device during the manufacturing process following FIG. 31.

The memory gate electrode can also be configured only of a polysilicon film and a metal film on the polysilicon film. A semiconductor device and a method of manufacturing the semiconductor device according to a third embodiment is now described with reference to FIGS. 31 and 32. FIGS. 31 and 32 are each a sectional view of the semiconductor device of the third embodiment during a manufacturing process of the semiconductor device. FIGS. 31 and 32 show respective cross sections at positions corresponding to those of the cross sections shown in FIGS. 12 to 24, which each show a cross section of a memory cell along the longitudinal direction of the fin and a cross section of the memory cell along the lateral direction of the fin. It is now described that the memory gate electrode is formed of a polysilicon film and a stacked metal film on the polysilicon film.

First, steps similar to those described with reference to FIGS. 7 to 23 and 28 are performed. Subsequently, as illustrated in FIG. 31, the entire polysilicon film PS2 is removed using an etching process. As a result, a trench is formed at a position where the polysilicon film PS2 has been provided, and the top of the metal film M2 is exposed on the bottom and on one side face of the trench. The control gate electrode CG covered with the above-described protective film (not shown) is not removed.

Subsequently, as illustrated in FIG. 32, the metal film M3 is formed by, for example, a sputtering process on the main surface of the semiconductor substrate SB including the inside of the trench. The metal film M3 is thus embedded in the trench. Subsequently, the excess metal film M3 on the interlayer insulating film IL1 is removed by, for example, a CMP process, so that the metal film M3 is left only in the trench. This results in formation of the memory gate electrode MG including a stacked film of the polysilicon film PS1, the metal film M2, and the metal film M3.

The metal film M3 includes, for example, an aluminum (Al) film or a tungsten (W) film. Since the metal film M3 is not in contact with the polysilicon film PS1, it is not necessary to use a material having a relatively low reactivity with silicon as the material of the metal film M3. It is therefore possible to reduce the resistance of the metal film M3 as compared with the case where titanium nitride (TiN) or the like, which is a material having a relatively low reactivity with silicon, is used as a material of the metal film M3.

Subsequently, steps similar to those described with reference to FIG. 24 are performed, thereby the semiconductor device of the third embodiment is substantially completed.

In the third embodiment, the memory gate electrode MG is formed of the polysilicon film PS1, the metal film M2, and the metal film M3 formed in order from the bottom. In the third embodiment, therefore, it is possible to reduce the resistance of the memory gate electrode MG as compared with the case where the memory gate electrode MG is formed of the stacked film including the polysilicon film PS1, the metal film M2, and the polysilicon film PS2 formed in order from the bottom.

It is therefore possible to reduce the resistance of the entire memory gate electrode MG by forming the low-resistance metal films M2 and M3 in the vicinity of the side face of the fin FA. Further, a proportion of the metal film forming the memory gate electrode MG is increased to reduce the resistance of the memory gate electrode MG, thereby performance of the semiconductor device can be improved. Even if part of the memory gate electrode MG is thus formed of the metal films M2 and M3, since the polysilicon film PS1 is interposed between the metal films M2 and M3 and the ONO film ON, it is possible to prevent the top oxide film from reacting with the metal unlike the comparative example described with reference to FIG. 34.

Although the invention achieved by the inventors has been described in detail according to some embodiments thereof hereinbefore, the invention should not be limited thereto, and it will be appreciated that various modifications or alterations thereof may be made within the scope without departing from the gist of the invention.

In the steps described with reference to FIGS. 22 and 23, the dummy gate electrode DG1 (see FIG. 21) is replaced with a metal film, and the control gate electrode CG including the metal film is formed. On the other hand, the steps described with reference to FIGS. 22 and 23 may not be performed while the gate electrode including the semiconductor film SI2 (see FIG. 12) is formed as the control gate electrode CG rather than the dummy gate electrode DG1, and is used as the control gate electrode CG configuring the memory cell MC.

What is claimed is:

1. A semiconductor device, comprising:
   a semiconductor substrate;
   protrusions that are each a portion of the semiconductor substrate, protrude from a top of the semiconductor substrate, and extend in a first direction along the top of the semiconductor substrate;
   a first gate electrode that is provided over a top of each of the protrusions with a first insulating film in between, and extends in a second direction orthogonal to the first direction;
   a second gate electrode that is provided over the top and a side face of the protrusions with a second insulating film including a charge storage part in between, is adjacent to one side face of the first gate electrode with the second insulating film in between, and extends in the second direction; and
   a source region and a drain region that are provided in the protrusions so as to sandwich a channel region that is directly below a pattern including the first gate electrode and the second gate electrode,
   wherein the first gate electrode, the second gate electrode, the source region, and the drain region configure a nonvolatile memory element,
   wherein the second gate electrode includes a first semiconductor film formed on the second insulating film and a first metal film formed on the first semiconductor film, and the first semiconductor film and the first metal film are embedded between protrusions adjacent to each other in the second direction, and
   wherein the first semiconductor film is interposed between the first metal film and the second insulating film.

2. The semiconductor device according to claim 1, wherein the second gate electrode includes the first semiconductor film, the first metal film, and a second semiconductor film formed in this order over the semiconductor substrate.

3. The semiconductor device according to claim 2, wherein the second semiconductor film is embedded between the protrusions adjacent to each other in the second direction.

4. The semiconductor device according to claim 2, wherein a top of the second semiconductor film is covered with a silicide layer.

5. The semiconductor device according to claim 2, wherein a top of the first metal film exists over a top of the second gate electrode, and a plug is coupled to the top of the first metal film.

6. The semiconductor device according to claim 2, wherein a bottom of a plug penetrating through the second semiconductor film is coupled to a top of the first metal film.

7. The semiconductor device according to claim 1,
wherein the second gate electrode includes the first semiconductor film, the first metal film, and a silicide layer formed in this order over the semiconductor substrate, and
wherein a bottom of the silicide layer is in contact with a top of the first metal film.

8. The semiconductor device according to claim 7, wherein the silicide layer is embedded between the protrusions adjacent to each other in the second direction.

9. The semiconductor device according to claim 1, wherein the second gate electrode includes the first semiconductor film, the first metal film, and a second metal film formed in this order over the semiconductor substrate.

10. The semiconductor device according to claim 9, wherein the second metal film includes an aluminum film or a tungsten film.

11. The semiconductor device according to claim 1,
wherein the first semiconductor film includes a silicon film, and
wherein the first metal film includes a titanium nitride film.

12. The semiconductor device according to claim 1, wherein a silicon oxide film or an aluminum oxide film is interposed between the charge storage part and the second gate electrode.

* * * * *